United States Patent
Kim et al.

(10) Patent No.: US 11,342,487 B2
(45) Date of Patent: May 24, 2022

(54) LIGHT EMITTING DEVICE PACKAGE

(71) Applicant: SUZHOU LEKIN SEMICONDUCTOR CO., LTD., Taicang (CN)

(72) Inventors: Won Jung Kim, Seoul (KR); Ki Seok Kim, Seoul (KR); June O Song, Seoul (KR); Chang Man Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 55 days.

(21) Appl. No.: 16/646,700

(22) PCT Filed: Sep. 14, 2018

(86) PCT No.: PCT/KR2018/010861
§ 371 (c)(1),
(2) Date: Mar. 12, 2020

(87) PCT Pub. No.: WO2019/054802
PCT Pub. Date: Mar. 21, 2019

(65) Prior Publication Data
US 2020/0411738 A1    Dec. 31, 2020

(30) Foreign Application Priority Data
Sep. 15, 2017 (KR) ........................ 10-2017-0118974

(51) Int. Cl.
*H01L 33/56* (2010.01)
*H01L 33/50* (2010.01)
(Continued)

(52) U.S. Cl.
CPC ............ *H01L 33/56* (2013.01); *H01L 33/502* (2013.01); *H01L 33/60* (2013.01); *H01L 33/62* (2013.01)

(58) Field of Classification Search
CPC ....... H01L 33/56; H01L 33/502; H01L 33/60; H01L 33/62; H01L 2933/0091;
(Continued)

(56) References Cited

U.S. PATENT DOCUMENTS 10,319,889 B2 * 6/2019 Yuasa ..................... H01L 33/46
2009/0256064 A1 10/2009 Saito
(Continued)

FOREIGN PATENT DOCUMENTS

JP          2009-259935       11/2009
KR     10-2013-0054040         5/2013
(Continued)

OTHER PUBLICATIONS

International Search Report dated Dec. 28, 2018 issued in Application No. PCT/KR2018/010861.

*Primary Examiner* — Jonathan Han
(74) *Attorney, Agent, or Firm* — Birch, Stewart, Kolasch & Birch, LLP

(57) ABSTRACT

A light emitting device package according to an embodiment may comprise: a first package body including a first and a second opening; a light emitting device disposed on the first package body and including a first and a second bonding part; and a first resin disposed between the first package body and the light emitting device. The light emitting device may comprise one surface on which the first and second bonding parts are disposed, the first bonding part may comprise a first side surface and a lower surface facing the first package body, and the second bonding part may comprise a second side surface opposite to the first side surface, and a lower surface facing the first package body. The first resin may comprise an upper surface disposed on the one surface of the light emitting device, a third side surface extending from the upper surface to the lower surface of the first bonding part along the first side surface of the first bonding part, and a fourth side surface extending from the upper surface to the lower surface of the second bonding part along the second side surface of the second bonding part.

20 Claims, 11 Drawing Sheets

(51) Int. Cl.
*H01L 33/60* (2010.01)
*H01L 33/62* (2010.01)

(58) Field of Classification Search
CPC ............ H01L 33/50; H01L 33/48–486; H01L 2933/0033; H01L 25/167
See application file for complete search history.

(56) References Cited

U.S. PATENT DOCUMENTS

| | | |
|---|---|---|
| 2013/0121000 A1 | 5/2013 | Lee et al. |
| 2013/0307000 A1* | 11/2013 | Ikenaga ................ H01L 33/486 257/91 |
| 2015/0188011 A1* | 7/2015 | Kang ...................... H01L 33/60 257/98 |
| 2017/0244012 A1* | 8/2017 | Choi ....................... H01L 33/52 |
| 2018/0108812 A1 | 4/2018 | Jung et al. |
| 2019/0019929 A1* | 1/2019 | Lim ...................... H01L 33/502 |
| 2019/0088824 A1* | 3/2019 | Kim ........................ H01L 33/62 |

FOREIGN PATENT DOCUMENTS

| | | |
|---|---|---|
| KR | 10-2013-0140097 A | 12/2013 |
| KR | 10-2014-0061797 | 5/2014 |
| KR | 10-2015-0078295 | 7/2015 |
| KR | 10-2016-0115309 | 10/2016 |

* cited by examiner

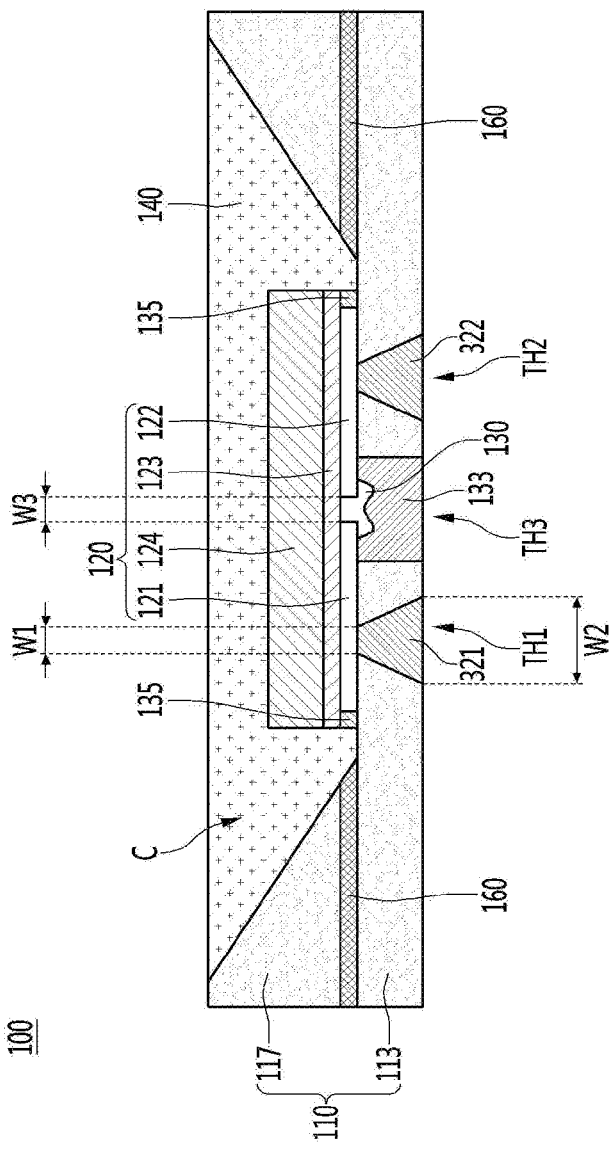
[FIG. 1]

【FIG. 2】
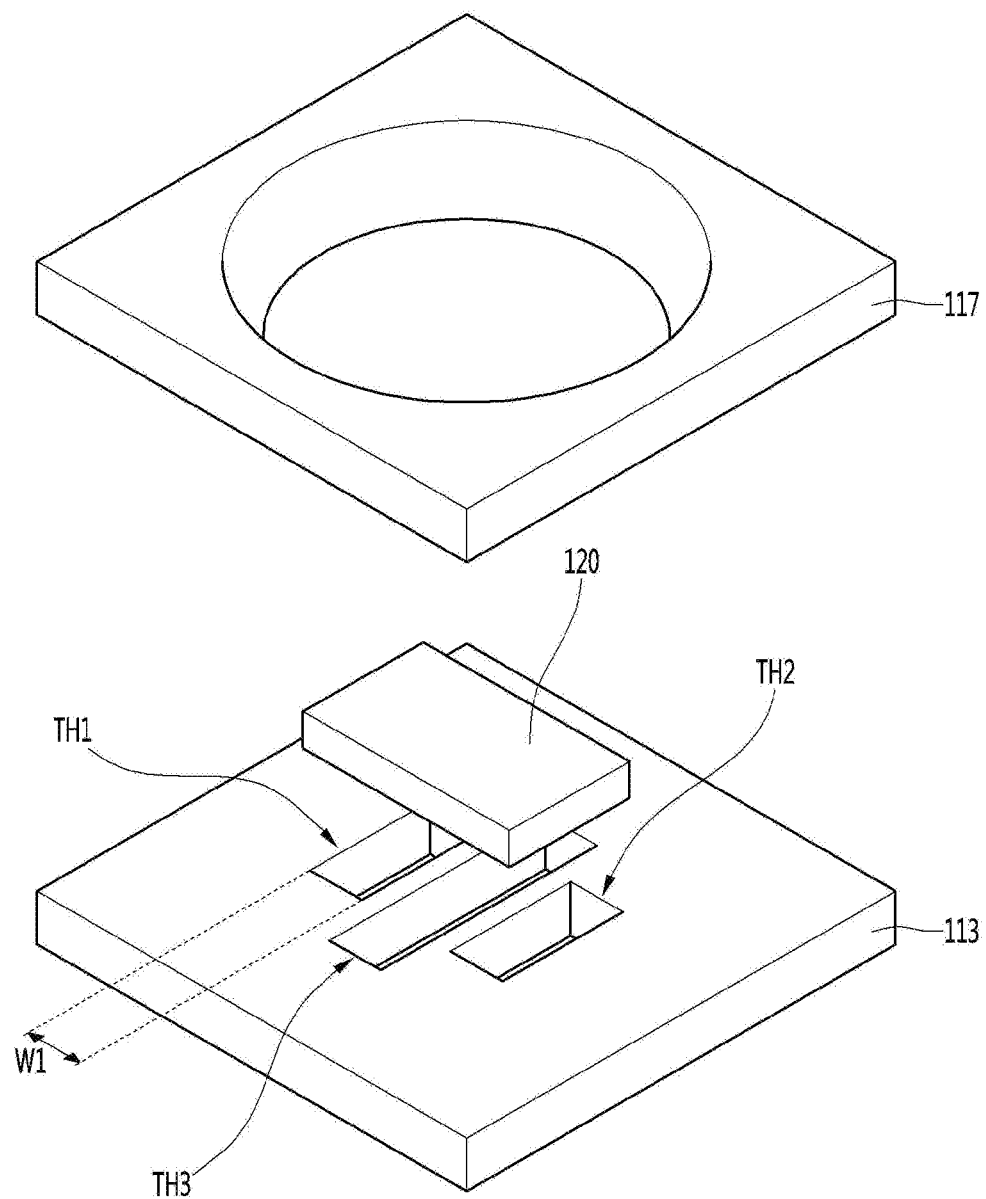

【FIG. 3】
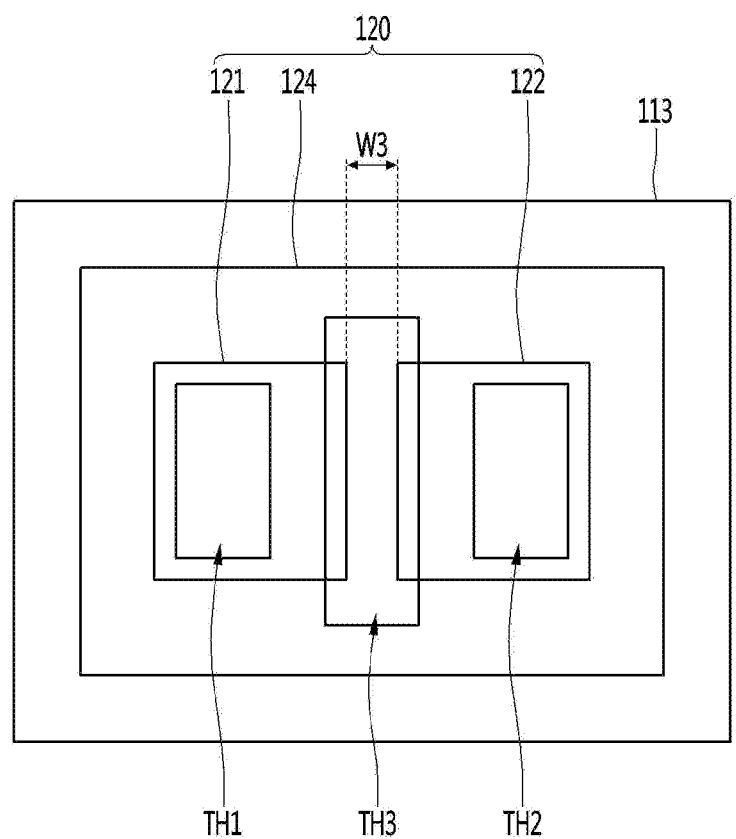

[FIG. 4]
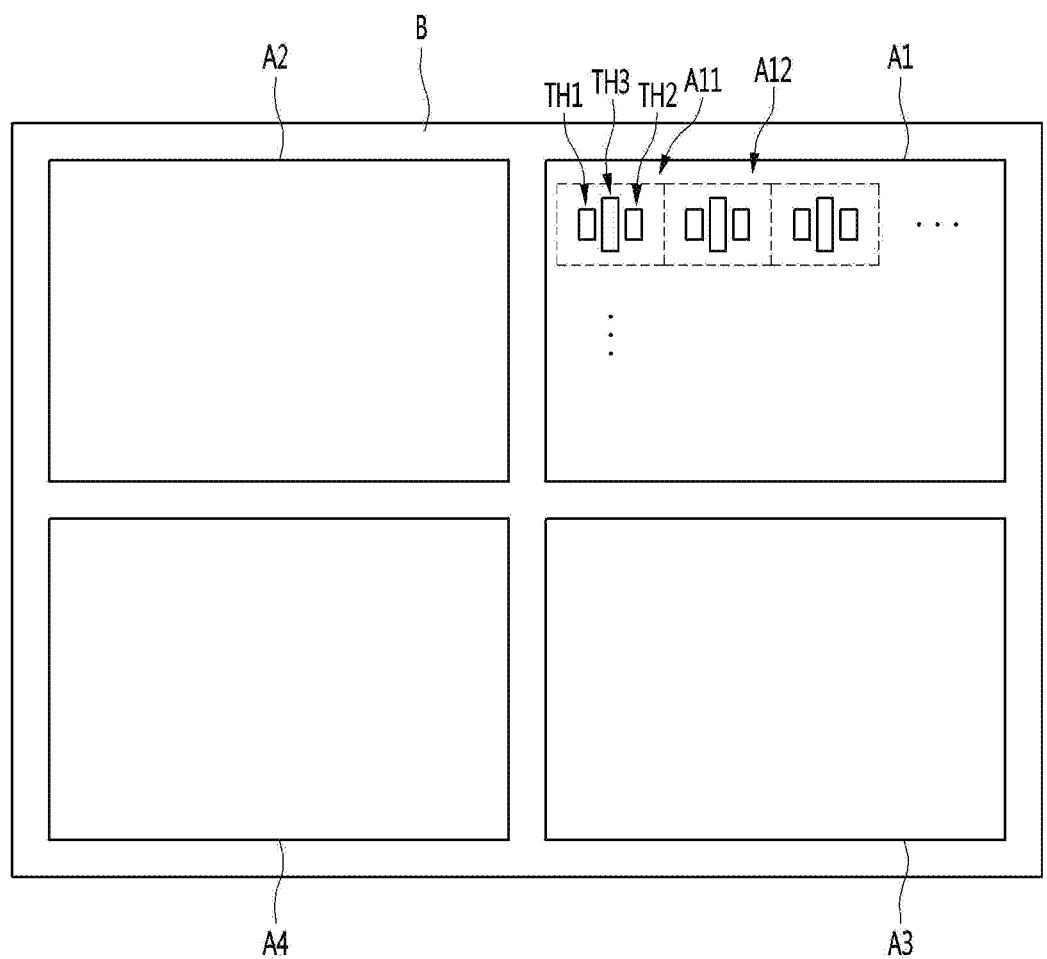

【FIG. 5】
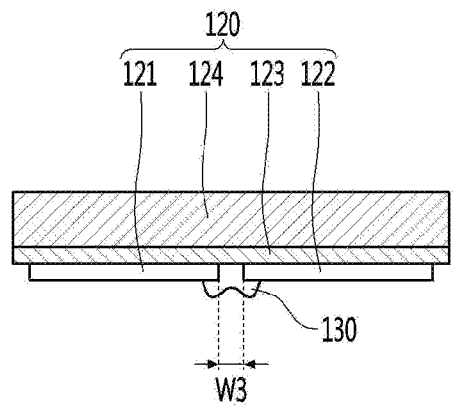
【FIG. 6】
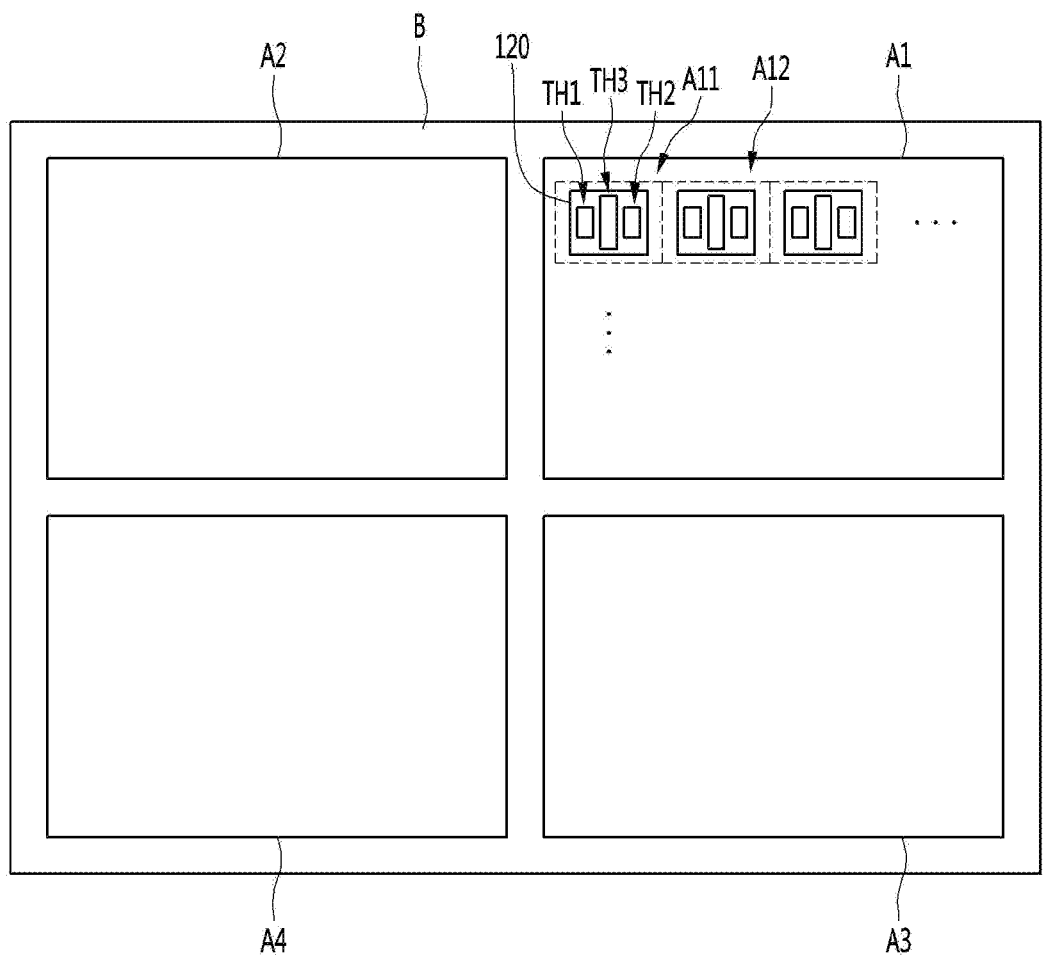

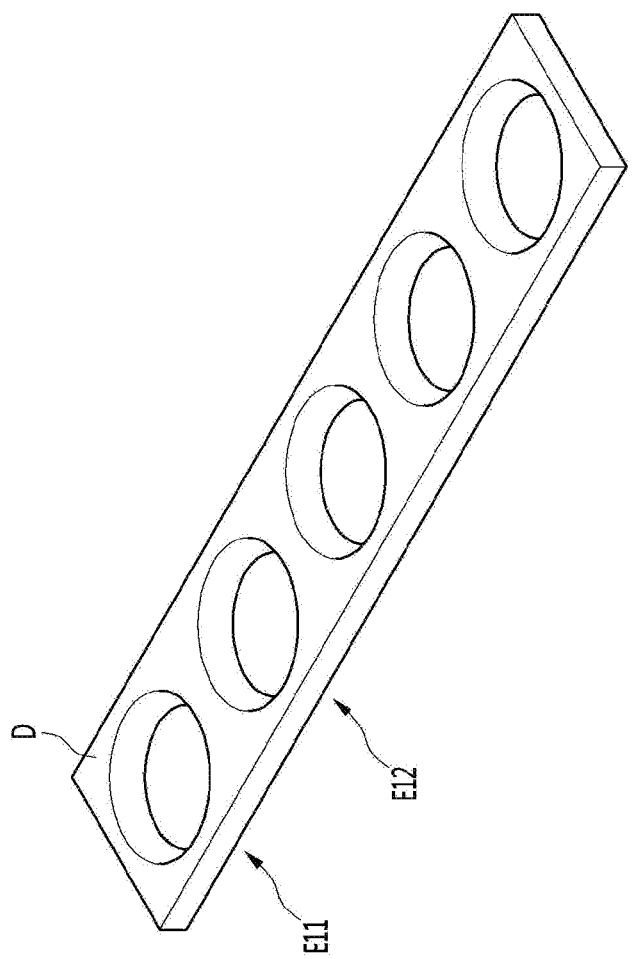
[FIG. 7]

[FIG. 8]
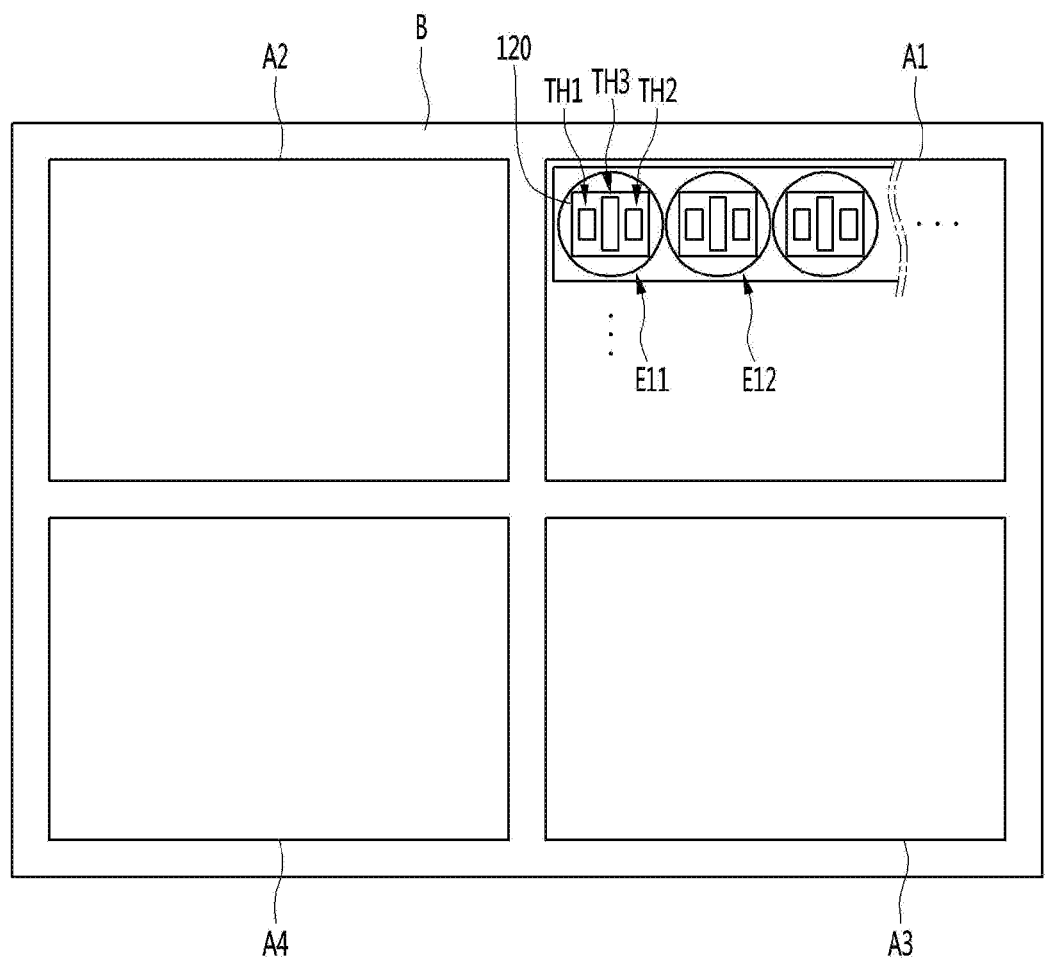

[FIG. 9]
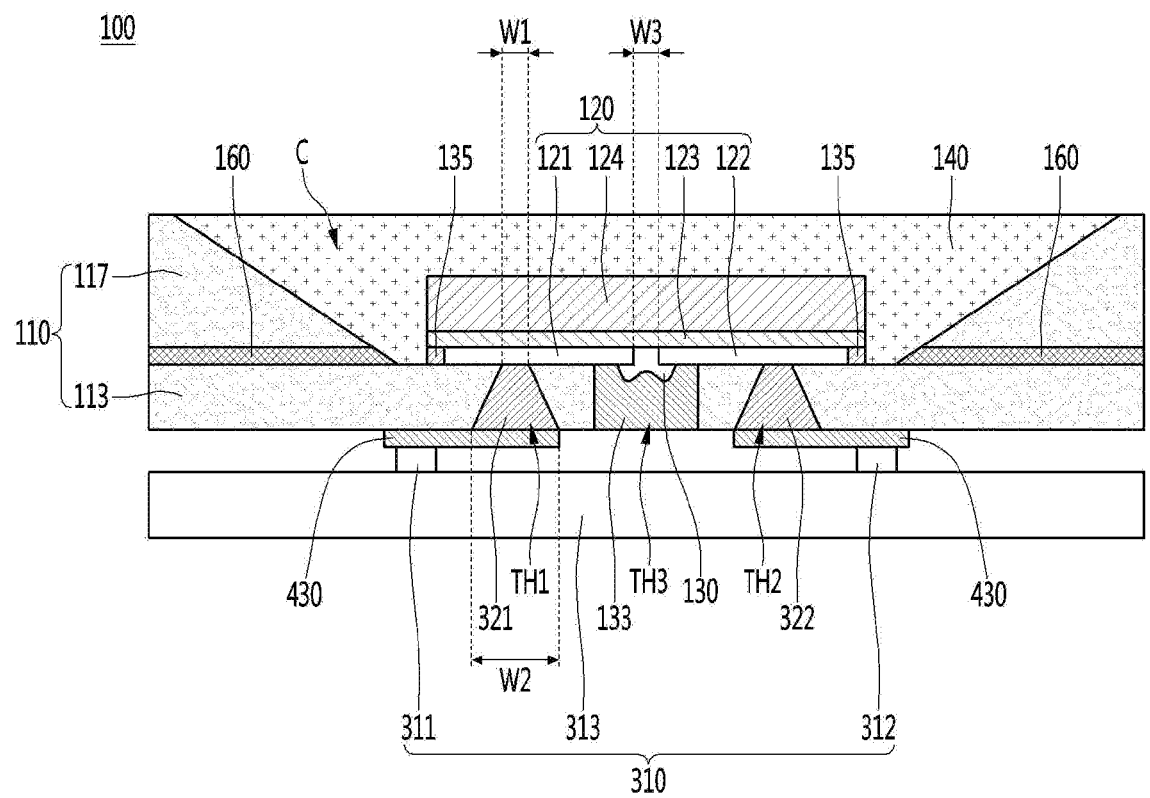

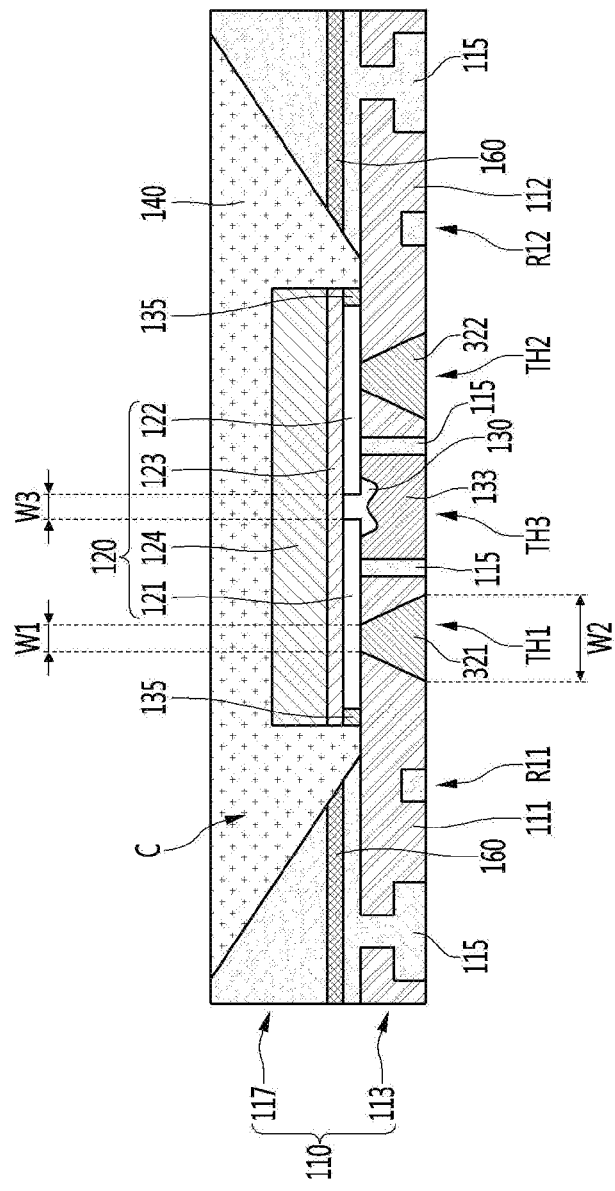
[FIG. 10]

[FIG. 11]
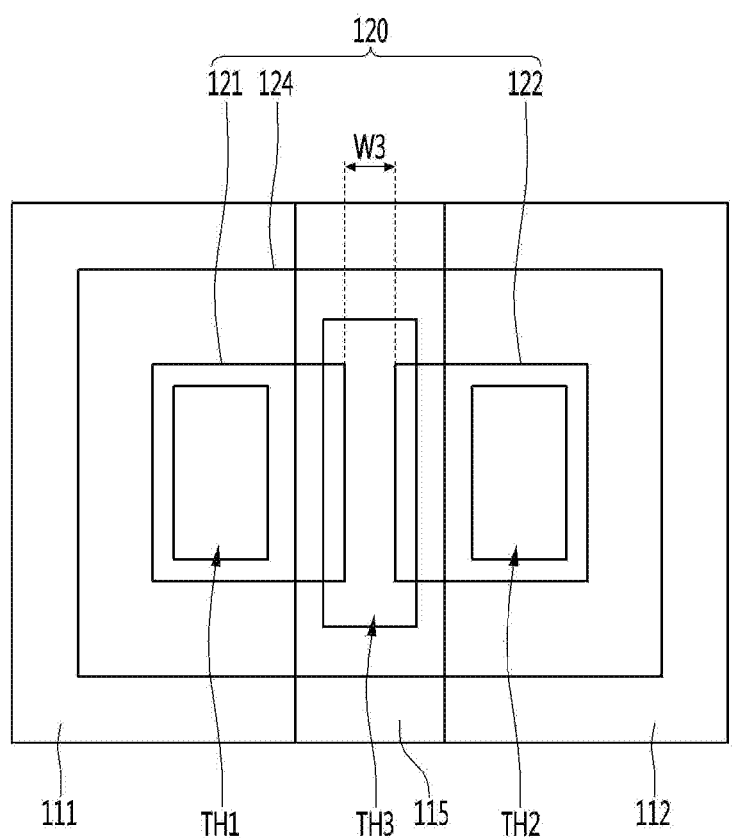

[FIG. 12]
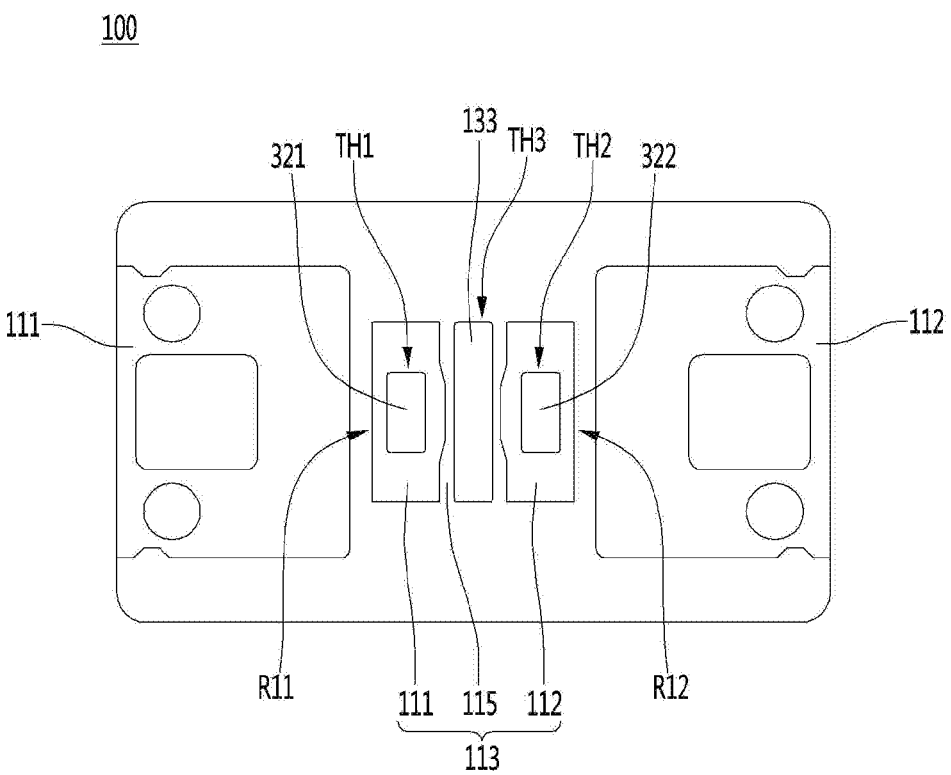
[FIG. 13]
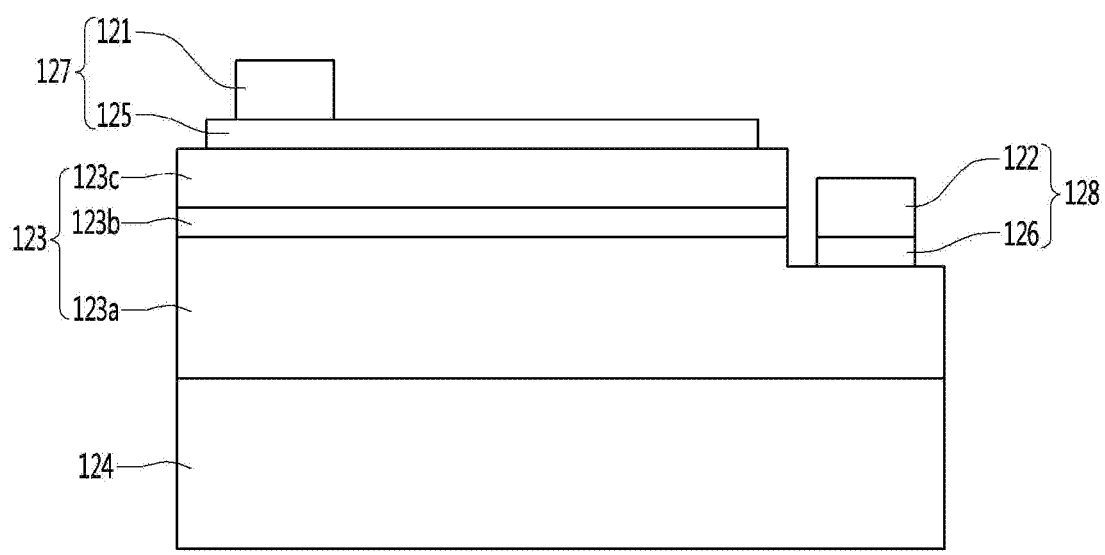

LIGHT EMITTING DEVICE PACKAGE

CROSS-REFERENCE TO RELATED PATENT APPLICATIONS

This application is a U.S. National Stage Application under 35 U.S.C. § 371 of PCT Application No. PCT/KR2018/010861, filed Sep. 14, 2018, which claims priority to Korean Patent Application No. 10-2017-0118974, filed Sep. 15, 2017, whose entire disclosures are hereby incorporated by reference.

FIELD OF THE INVENTION

The embodiments relate to a semiconductor device package, a method of manufacturing a semiconductor device package, and a light source device.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a semiconductor device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication means, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method of improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, research on a method of reducing the manufacturing cost and improving the manufacturing yield by improving the process efficiency and changing the structure in a semiconductor device package has been studied.

SUMMARY OF THE INVENTION

Embodiments can provide a semiconductor device package, a method of manufacturing a semiconductor device package, and a light source device, that are capable of improving light extraction efficiency and electrical characteristics.

Embodiments can provide a semiconductor device package, a method of manufacturing a semiconductor device package, and a light source device, that are capable of reducing manufacturing cost and improving manufacturing yield by improving process efficiency and providing new package structure.

Embodiments can provide a semiconductor device package and a method of manufacturing a semiconductor device package that are capable of preventing a re-melting phenomenon from occurring in a bonding region of a semiconductor device package in a process of re-bonding the semiconductor device package to a board or the like.

A light emitting device package according to an embodiment may comprise: a first package body comprising first and second openings; a light emitting device disposed on the first package body and comprising first and second bonding parts; and a first resin disposed between the first package body and the light emitting device, wherein the light emitting device may comprise a first surface on which the first and second bonding parts are disposed, wherein the first bonding part may comprise a first side surface and a lower surface facing the first package body, wherein the second bonding part may comprise a second side surface facing the first side surface and a lower surface facing the first package body, wherein the first resin may comprise an upper surface disposed on the first surface of the light emitting device, a third side surface extending from the upper surface to a lower surface of the first bonding part along the first side surface of the first bonding part, and a fourth side surface extending from the upper surface to a lower surface of the second bonding part along the second side surface of the second bonding part, wherein the upper surface of the first resin may be disposed between the first bonding part and the second bonding part, wherein the first resin may comprise a first lower surface disposed under the first bonding part, a second lower surface disposed under the second bonding part, and a third lower surface connecting the first lower surface and the second lower surface, wherein the first opening and the first bonding part may be vertically overlapped with each other, and wherein the second opening and the second bonding part may be vertically overlapped with each other.

A light emitting device package according to an embodiment may comprise a second package body disposed on the first package body and an adhesive layer disposed between the first package body and the second package body.

A light emitting device package according to an embodiment may comprise a second resin disposed in the third opening, wherein an upper surface of the second resin may be in contact with the first resin, and a side surface of the second resin may be in contact with a side surface of the first package body providing the third opening.

According to an embodiment, the upper surface of the second resin may be in contact with the lower surfaces of the first and second bonding parts.

A light emitting device package according to an embodiment may comprise a third resin disposed between the light emitting device and the first package body and disposed in contact with the side surfaces of the first and second bonding parts.

According to an embodiment, the side surface of the first resin may be disposed in contact with the side surfaces of the first and second bonding parts.

According to an embodiment, a gap between the facing side surfaces of the first and second bonding parts may be provided of several tens of micrometers.

According to an embodiment, the first package body and the second package body may comprise different materials each other.

A light emitting device package according to an embodiment may comprise a first conductive layer disposed in the first opening and electrically connected with the first bonding part, and a second conductive layer disposed in the second opening and electrically connected with the second bonding part.

According to an embodiment, the first package body and the second package body may comprise different materials selected from PPA, PCT, EMC, SMC, and PI, and the first package body may be formed of a transparent resin, and the second package body may comprise at least one of a wavelength conversion material and a reflective material.

Advantageous Effects

According to the semiconductor device package and the method of manufacturing the semiconductor device package of the embodiments, there is an advantage that light extraction efficiency, electrical characteristics and reliability can be improved.

According to the semiconductor device package and the method of manufacturing the semiconductor device package of the embodiments, there is an advantage that manufacturing cost can be reduced and manufacturing yield can be improved by improving process efficiency and providing a new package structure.

The semiconductor device package according to the embodiment has an advantage that the reflector can be prevented from being discolored by providing the body with high reflectance, thereby improving the reliability of the semiconductor device package.

According to the semiconductor device package and the method of manufacturing the semiconductor device of the embodiments, there is an advantage that re-melting phenomenon can be prevented from occurring in the bonding region of the semiconductor device package in the process of re-bonding the semiconductor device package to a board or the like, or heat treatment.

BRIEF DESCRIPTION OF THE DRAWINGS

FIG. 1 is a view illustrating a light emitting device package according to an embodiment of the present invention.

FIG. 2 is an exploded perspective view illustrating a light emitting device package according to an embodiment of the present invention.

FIG. 3 is a view explaining an arrangement of openings and a light emitting device of a light emitting device package according to an embodiment of the present invention.

FIGS. 4 to 8 are views illustrating a method of manufacturing a light emitting device package according to an embodiment of the present invention.

FIG. 9 is a view illustrating another example of a light emitting device package according to an embodiment of the present invention.

FIG. 10 is a view illustrating another example of a light emitting device package according to an embodiment of the present invention.

FIG. 11 is a view explaining an arrangement of openings and a light emitting device of the light emitting device package shown in FIG. 10.

FIG. 12 is a bottom view of the light emitting device package shown in FIG. 10.

FIG. 13 is a view illustrating a light emitting device applied to a light emitting device package according to an embodiment of the present invention.

DETAILED DESCRIPTION OF EMBODIMENTS

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package and a method of manufacturing a semiconductor device package according to an embodiment of the present invention will be described in detail with reference to the accompanying drawings. Hereinafter, a case where a light emitting device is applied as an example of a semiconductor device will be described.

First, referring to FIGS. 1 to 3, a light emitting device package according to an embodiment of the present invention will be described. FIG. 1 is a view illustrating a light emitting device package according to an embodiment of the present invention, FIG. 2 is an exploded perspective view illustrating a light emitting device package according to an embodiment of the present invention, and FIG. 3 is a view explaining an arrangement of openings and a light emitting device of a light emitting device package according to an embodiment of the present invention.

The light emitting device package 100 according to the embodiment may comprise a package body 110 and a light emitting device 120, as shown in FIGS. 1 to 3.

The package body 110 may comprise a first package body 113 and a second package body 117. The second package body 117 may be disposed on the first package body 113. The second package body 117 may be disposed around an upper surface of the first package body 113. The second package body 117 may provide a cavity C on the upper surface of the first package body 113. The second package body 117 may comprise an opening that passes through the upper surface and the lower surface thereof.

In other words, the first package body 113 may be referred to as a lower body, and the second package body 117 may be referred to as an upper body. In addition, according to the embodiment, the package body 110 may not comprise the second package body 117 that provides the cavity, but may comprise only the first package body 113 that provides a flat upper surface.

The second package body 117 may reflect upward the light emitted from the light emitting device 120. The second package body 117 may be inclined with respect to the upper surface of the first package body 113.

The package body 110 may comprise the cavity C. The cavity may comprise a bottom surface and a side surface inclined to an upper surface of the package body 110 from the bottom surface.

According to the embodiment, the package body 110 may be provided with a cavity C, or may be provided with a flat upper surface without a cavity C.

For example, the package body 110 may be formed of a material selected from a group including polyphthalamide (PPA), polychloro tri phenyl (PCT), liquid crystal polymer (LCP), polyamide 9T (PA9T), silicone, epoxy molding compound (EMC), silicone molding compound (SMC), ceramics, polyimide (PI), photo sensitive glass (PSG), sapphire ($Al_2O_3$), and the like. In addition, the package body 110 may comprise a reflective material of high refractive index fillers such as $TiO_2$ and $SiO_2$. The package body 110 may comprise a wavelength converting material such as a quantum dot, a fluorescent material, or the like.

Meanwhile, according to the embodiment, the first package body 113 and the second package body 117 may comprise different materials each other. For example, the first package body 113 and the second package body 117 may be formed of different materials in different processes and then coupled together. For example, the first package body 113 and the second package body 117 may be coupled to each other through an adhesive layer 160.

The adhesive layer 160 may be disposed between the first package body 113 and the second package body 117. The adhesive layer 160 may be disposed on the upper surface of the first package body 113. The adhesive layer 160 may be disposed on the lower surface of the second package body 117. The adhesive layer 160 may be disposed around the light emitting device 120 to provide the cavity.

The adhesive layer 160 may comprise at least one of an epoxy-based material, a silicone-based material, and a hybrid material including an epoxy-based material and a silicone-based material. In addition, the adhesive layer 160 may reflect light emitted from the light emitting device 120. When the adhesive layer 160 comprises a reflection function, the adhesive may comprise white silicone.

Meanwhile, each of the first package body 113 and the second package body 117 may comprise at least one selected from resin materials including polyphthalamide (PPA), polychloro tri phenyl (PCT), liquid crystal polymer (LCP), polyamide 9T (PA9T), epoxy molding compound (EMC), silicone molding compound (SMC), polyimide (PI), or the like, as a base material.

In addition, each of the first package body 113 and the second package body 117 may comprise at least one of a reflective material and a wavelength conversion material. In addition, the first package body 113 and the second package body 117 may not comprise a reflective material and a wavelength conversion material. The first package body 113 and the second package body 117 may be formed of transparent resin.

The first package body 113 and the second package body 117 may comprise different base materials. The first package body 113 and the second package body 117 may comprise different resin materials.

For example, the first package body 113 may comprise a reflective material, and the second package body 117 may comprise a wavelength conversion material. In addition, the first package body 113 may comprise a wavelength conversion material, and the second package body 117 may comprise a reflective material.

According to the embodiment, the first package body 113 may comprise a reflective material, and the second package body 117 may comprise a reflective material and a wavelength conversion material. In addition, the first package body 113 may comprise a reflective material and a wavelength conversion material, and the second package body 117 may comprise a wavelength conversion material.

In the light emitting device package 100 according to the embodiment, the first package body 113 and the second package body 117 including different base materials may be formed separately in different processes and then be manufactured in a modular manner through an optional combination that is capable of satisfying characteristics required for the application product. A method of manufacturing the light emitting device package according to an embodiment will be described later.

According to an embodiment, the light emitting device 120 may comprise a first bonding part 121, a second bonding part 122, a light emitting structure 123, and a substrate 124.

The light emitting device 120 may comprise the light emitting structure 123 disposed under the substrate 124. The light emitting structure 123 may comprise a first conductivity type semiconductor layer, a second conductivity type semiconductor layer, an active layer disposed between the first conductivity type semiconductor layer and the second conductivity type semiconductor layer. The first bonding part 121 may be electrically connected to the first conductivity type semiconductor layer. Also, the second bonding part 122 may be electrically connected to the second conductivity type semiconductor layer.

The light emitting device 120 may be disposed on the package body 110. The light emitting device 120 may be disposed on the first package body 113. The light emitting device 120 may be disposed in the cavity C provided by the second package body 117.

The first bonding part 121 may be disposed on the lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed between the light emitting structure 123 and the first package body 113. The second bonding part 122 may be disposed between the light emitting structure 123 and the first package body 113.

Each of the first bonding part 121 and the second bonding part 122 may be provided as a single layer or a multilayer by using one or more materials selected from a group including Ti, Al, Sn, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, and Ni/$IrO_x$/Au/ITO, or an alloy thereof.

Meanwhile, as illustrated in FIGS. 1 to 3, the light emitting device package 100 according to the embodiment may comprise a first opening TH1 and a second opening TH2.

The package body 110 may comprise the first opening TH1 passing through the lower surface of the package body 110 from the lower surface of the cavity C. The package body 110 may comprise the second opening TH2 passing through the lower surface of the package body 110 from the lower surface of the cavity C.

For example, the first package body 113 may have a flat lower surface and may comprise an upper surface parallel to the lower surface. The first and second openings TH1 and TH2 may pass through the upper and lower surfaces of the first package body 113.

The first opening TH1 may be provided in the first package body 113. The first opening TH1 may be provided to pass through the first package body 113. The first opening TH1 may be provided to pass through the upper and lower surfaces of the first package body 113 in a first direction.

The first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first package body 113.

The second opening TH2 may be provided in the first package body 113. The second opening TH2 may be provided to pass through the first package body 113. The second opening TH2 may be provided to pass through the upper and lower surfaces of the first package body 113 in the first direction.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the first package body 113.

The first opening TH1 and the second opening TH2 may be spaced apart from each other. The first opening TH1 and the second opening TH2 may be spaced apart from each other under the lower surface of the light emitting device 120.

According to an embodiment, a width W1 of an upper region of the first opening TH1 may be less than or equal to a width of the first bonding part 121. Also, a width of the upper region of the second opening TH2 may be less than or equal to a width of the second bonding part 122.

Also, the width W1 of the upper region of the first opening TH1 may be less than or equal to a width W2 of a lower region of the first opening TH1. Also, the width of the upper region of the second opening TH2 may be less than or equal to a width of a lower region of the second opening TH2.

The first opening TH1 may be provided in an inclined shape of which a width gradually decreases from the lower region to the upper region. The second opening TH2 may be provided in an inclined shape of which a width gradually decreases from the lower region to the upper region.

However, the present invention is not limited thereto, and an inclined surfaces between the upper and lower regions of the first and second openings TH1 and TH2 may have a plurality of inclined surfaces having different inclinations, and each of the inclined surfaces may be disposed with a curvature.

A width between the first opening TH1 and the second opening TH2 on an area of the lower surface of the first package body 113 may be provided to several hundred micrometers. A width between the first opening TH1 and the second opening TH2 on an area of the lower surface of the first package body 113 may be provided to 100 micrometers to 150 micrometers.

The depth of the first opening TH1 may be provided corresponding to a thickness of the first package body 113. The depth of the first opening TH1 may be provided to a thickness that is enough to maintain the stable strength of the first package body 113.

For example, the depth of the first opening TH1 may be provided to several hundred micrometers. The depth of the first opening TH1 may be provided in a range from 180 micrometers to 220 micrometers. For example, the depth of the first opening TH1 may be provided to 200 micrometers.

The width between the first opening TH1 and the second opening TH2 on the area of the lower surface of the first package body 113 may be selected to be provided to a predetermined distance or more so as to prevent electrical short circuit from occurring between the bonding parts when the light emitting device package 100 according to an embodiment is mounted on a circuit board, a submount, and the like.

The light emitting device package 100 according to the embodiment may comprise a third opening TH3, as shown in FIGS. 1 to 3.

The third opening TH3 may be provided in the first package body 113. The third opening TH3 may be provided passing through the first package body 113. The third opening TH3 may be provided passing through the upper surface and the lower surface of the first package body 113 in a first direction.

The third opening TH3 may be disposed under the light emitting device 120. The third opening TH3 may be provided between the first opening TH1 and the second opening TH2. The third opening TH3 may be provided spaced apart from the first opening TH1. The third opening TH3 may be provided spaced apart from the second opening TH2.

A portion of the third opening TH3 may be provided to be overlapped with the first bonding part 121 of the light emitting device 120. A portion of the third opening TH3 may be provided to be overlapped with the first bonding part 121 of the light emitting device 120 in a first direction toward the lower surface from the upper surface of the first package body 113.

In addition, a portion of the third opening TH3 may be provided to be overlapped with the second bonding part 122 of the light emitting device 120. A portion of the third opening TH3 may be provided to be overlapped with the second bonding part 122 of the light emitting device 120 in a first direction toward the lower surface from the upper surface of the first package body 113.

When viewed from the upper direction of the light emitting device 120, the length of the third opening TH3 provided along the short axis direction of the light emitting device 120 may be provided larger than the length of the first and second openings TH1 and TH2 provided along the short axis direction of the light emitting device 120.

In addition, when viewed from the upper direction of the light emitting device 120, the length of the first and second bonding parts 121 and 122 provided along the short axis direction of the light emitting device 120 may be provided larger than the length of the first and second openings TH1 and TH2 provided along the short axis direction of the light emitting device 120.

In addition, when viewed from the upper direction of the light emitting device 120, the length of the third opening TH3 provided along the short axis direction of the light emitting device 120 may be provided larger than the length of the first and second bonding parts 121 and 122 provided along the short axis direction of the light emitting device 120.

The light emitting device package 100 according to the embodiment may comprise a first resin 130, as shown in FIG. 1.

The first resin 130 may be disposed between the first bonding part 121 and the second bonding part 122. The first resin 130 may be disposed in contact with a side surface of the first bonding part 121. The first resin 130 may be disposed in contact with a side surface of the second bonding part 122. The first resin 130 may be disposed in contact with the lower surface of the light emitting structure 123 between the first bonding part 121 and the second bonding part 122.

The first resin 130 may prevent an electrical short between the first bonding part 121 and the second bonding part 122. The first resin 130 may comprise an insulating material.

For example, the first resin 130 may comprise at least one of an epoxy-based material, a silicone-based material, and a hybrid material including an epoxy-based material and a silicone-based material.

In addition, the first resin 130 may reflect light emitted from the light emitting device 120. When the first resin 130 comprises a reflection function, the first resin 130 may comprise white silicone. When the first resin 130 comprises a reflection function, the first resin 130 may be formed of a material including, for example, $TiO_2$, $SiO_2$, and the like. The first resin 130 may be referred to as an adhesive.

The upper surface of the first resin 130 may be disposed in contact with the lower surface of the light emitting structure 123. One side of the first resin 130 may be disposed in contact with a side surface of the first bonding part 121.

In addition, the other side of the first resin 130 may be disposed in contact with a side surface of the second bonding part 122.

The lower surface of the first resin 130 may be disposed lower than the lower surfaces of the first and second bonding parts 121 and 122. A portion of the first resin 130 may be disposed in contact with the lower surface of the first bonding part 121. A portion of the first resin 130 may be disposed in contact with the lower surface of the second bonding part 122.

The lower surface of the first resin 130 may be disposed lower than the upper surface of the first package body 113. The first resin 130 may be provided to be overlap with the third opening TH3 in the first direction.

According to the embodiment, the first bonding part 121 may comprise a first side surface and a lower surface facing the first package body 113. Also, the second bonding part 122 may comprise a second side surface facing the first side surface and a lower surface facing the first package body 113.

In addition, the first resin 130 may comprise an upper surface disposed on a surface of the light emitting device 120, a third side surface extending from the upper surface to a lower surface of the first bonding part 121 along the first side surface of the first bonding part 121, and a fourth side surface extending from the upper surface to a lower surface of the second bonding part 122 along the second side surface of the second bonding part 122.

The upper surface of the first resin 130 may be disposed between the first bonding part 121 and the second bonding part 122. The upper surface of the first resin 130 may be disposed to face the lower surface of the light emitting device 120. The first resin 130 may comprise a first lower surface disposed under the first bonding part 121 and a second lower surface disposed under the second bonding part 122. In addition, the first resin 130 may comprise a third lower surface connecting the first lower surface and the second lower surface.

The light emitting device package 100 according to the embodiment may comprise a second resin 133 as shown in FIG. 1.

The second resin 133 may be provided in the third opening TH3. The second resin 133 may be disposed between the first opening TH1 and the second opening TH2. The second resin 133 may be disposed under the first resin 130.

The upper surface of the second resin 133 may be disposed in contact with the lower surface of the first resin 130. The upper surface of the second resin 133 may be disposed in contact with the lower surface of the first bonding part 121. The upper surface of the second resin 133 may be disposed in contact with the lower surface of the second bonding part 122. The side surface of the second resin 133 may be disposed in contact with the side surface of the first package body 113 in the third opening TH3.

The second resin 133 may provide a stable fixing force between the first package body 113 and the light emitting device 120. The second resin 133 may provide a stable fixing force between the first package body 113 and the first and second bonding parts 121 and 122.

For example, the second resin 133 may comprise at least one of an epoxy-based material, a silicone-based material, and a hybrid material including an epoxy-based material and a silicone-based material.

In addition, the second resin 133 may reflect light emitted from the light emitting device 120. When the second resin 133 comprises a reflection function, the second resin 133 may comprise white silicone. When the second resin 133 comprises a reflection function, the second resin 133 may be formed of a material including $TiO_2$, $SiO_2$, and the like. The second resin 133 may be referred to as an adhesive.

In addition, the light emitting device package 100 according to the embodiment may comprise a third resin 135 as shown in FIG. 1.

The third resin 135 may be disposed around the first bonding part 121. The third resin 135 may seal the upper region of the first opening TH1 together with the first resin 130. The third resin 135 may be disposed around the second bonding part 122. The third resin 135 may seal the upper region of the second opening TH2 together with the first resin 130.

The third resin 135 may provide a stable fixing force between the light emitting device 120 and the first package body 113. The third resin 135 may be disposed in direct contact with the upper surface of the first package body 113, for example. In addition, the third resin 135 may be disposed in direct contact with the lower surface of the light emitting device 120.

For example, the third resin 135 may comprise at least one of an epoxy-based material, a silicone-based material, and a hybrid material including an epoxy-based material and a silicone-based material. In addition, the first resin 130 may reflect light emitted from the light emitting device 120. When the third resin 135 includes a reflection function, the third resin 135 may comprise white silicone. When the third resin 135 includes a reflection function, the third resin 135 may be formed of a material including $TiO_2$, $SiO_2$, and the like. The third resin 135 may also be referred to as an adhesive.

In addition, the light emitting device package 100 according to the embodiment may comprise a fourth resin 140, as shown in FIG. 1.

The fourth resin 140 may be provided on the light emitting device 120. The fourth resin 140 may be disposed on the first package body 113. The fourth resin 140 may be disposed in the cavity C provided by the second package body 117.

The fourth resin 140 may comprise an insulating material. In addition, the fourth resin 140 may comprise a wavelength conversion material that receives light emitted from the light emitting device 120 and provides wavelength-converted light. For example, the fourth resin 140 may comprise a phosphor, a quantum dot, and the like.

Also, according to an embodiment, the light emitting structure 123 may be provided as a compound semiconductor. The light emitting structure 123 may be provided as, for example, Group II-VI or Group III-V compound semiconductors. For example, the light emitting structure 123 may comprise at least two elements selected from aluminum (Al), gallium (Ga), indium (In), phosphorus (P), arsenic (As), and nitrogen (N).

The light emitting structure 123 may comprise a first conductivity type semiconductor layer 110, an active layer 120, and a second conductivity type semiconductor layer 130.

The first and second conductivity type semiconductor layers may be implemented as at least one of Group III-V or Group II-VI compound semiconductors. For example, each of the first and second conductivity type semiconductor layers may comprise a semiconductor material having a compositional formula of $In_xAl_yGa_{1-x-y}N$ ($0 \leq x \leq 1$, $0 \leq y \leq 1$, $0 \leq x+y \leq 1$). For example, each of the first and second conductivity type semiconductor layers may comprise at least one selected from a group including GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer that is doped with an N-type dopant such as Si, Ge, Sn, Se, Te, and the like. The second conductivity type semiconductor layer may be a p-type semiconductor layer that is doped with a p-type dopant such as Mg, Zn, Ca, Sr, Ba, and the like.

The active layer may be formed of a compound semiconductor. For example, the active layer may be formed of at least one of Group III-V or Groups II-VI compound semiconductors. When the active layer has a multi-well structure, the active layer may comprise a plurality of well layers and a plurality of barrier layers, which are alternately arranged and may be formed of a material having a compositional formula of $In_xAl_yGa_{1-x-y}N$ ($0 \leq x \leq 1$, $0 \leq y \leq 1$). For example, the active layer may comprise at least one selected from a group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs, and the like.

Also, as illustrated in FIG. 1, the light emitting device package 100 according to an embodiment may comprise a first conductive layer 321 and a second conductive layer 322. The first conductive layer 321 may be spaced apart from the second conductive layer 322.

The first conductive layer 321 may be provided in the first opening TH1. The first conductive layer 321 may be disposed under the first bonding part 121. A width of the first conductive layer 321 may be less than the width of the first bonding part 121.

The first bonding part 121 may have a width in a second direction perpendicular to the first direction in which the first opening TH1 is formed. The width of the first bonding part 121 may be provided to be greater than a width of the first opening TH1 in the second direction.

The first conductive layer 321 may be disposed to directly contact the lower surface of the first bonding part 121. The first conductive layer 321 may be electrically connected to the first bonding part 121. The first conductive layer 321 may be disposed to be surrounded by the first package body 113.

The second conductive layer 322 may be provided in the second opening TH2. The second conductive layer 322 may be disposed under the second bonding part 122. A width of the second conductive layer 322 may be provided to be less than the width of the second bonding part 122.

The second bonding part 122 may have a width in the second direction perpendicular to the first direction in which the second opening TH2 is formed. The width of the second bonding part 122 may be provided to be greater than the width of the second opening TH2 in the second direction.

The second conductive layer 322 may be disposed to directly contact the lower surface of the second bonding part 122. The second conductive layer 322 may be electrically connected to the second bonding part 122. The second conductive layer 322 may be disposed to be surrounded by the first package body 113.

The first conductive layer 321 and the second conductive layer 322 may comprise at least one material selected from a group including Ag, Au, Pt, Sn, and Cu, or an alloy thereof. However, the present invention is not limited thereto, and a material capable of securing a conductive function may be used as each of the first conductive layer 321 and the second conductive layer 322.

For example, each of the first conductive layer 321 and the second conductive layer 322 may be formed using a conductive paste. The conductive paste may comprise a solder paste, a silver paste, and the like and may be provided as a multilayer that is formed of different materials or a multilayer or single layer formed of an alloy. For example, each of the first conductive layer 321 and the second conductive layer 322 may comprise a Sn—Ag—Cu (SAC) material.

According to an embodiment, the first conductive layer 321 may be electrically connected to the first bonding part 121, and the second conductive layer 322 may be electrically connected to the second bonding part 122. For example, external power may be supplied to the first conductive layer 321 and the second conductive layer 322, and thus, the light emitting device 120 may be driven.

The first resin 130 and the second resin 133 may perform a function of stably fixing the light emitting device 120 to the package body 110. Also, the third resin 135 may contact the side surfaces of the first and second bonding parts 121 and 122 and may be disposed around the first and second bonding parts 121 and 122. When viewed from the upper direction of the light emitting device 120, the third resin 135 may be disposed so that the first and second openings TH1 and TH2 are isolated from an outer region in which the fourth resin 140 is provided.

The third resin 135 may prevent the first and second conductive layers 321 and 322 provided in the first and second openings TH1 and TH2 from being flowed in the outward direction of the light emitting device 120.

When viewed from the upper side of the light emitting device 120, if the first and second conductive layers 321 and 322 move outward from the light emitting device 120, the first and second conductive layers 321 and 322 may be spread along the side surface of the light emitting device 120. As described above, when the first and second conductive layers 321 and 322 move to the side surfaces of the light emitting device 120, the first conductivity type semiconductor layer and the second conductivity type semiconductor layer of the light emitting device 120 may be electrically short-circuited. Also, when the first and second conductive layers 321 and 322 move to the side surface of the light emitting device 120, light extraction efficiency of the light emitting device 120 may be deteriorated.

However, according to an embodiment, since circumferential regions of the first and second bonding parts 121 and 122 may be sealed by the first resin 130, the first and second conductive layers 321 and 322 may be prevented from moving outward from the areas of the first and second openings TH1 and TH2.

Therefore, according to the light emitting device package 100 of an embodiment, the first and second conductive layers 321 and 322 may be prevented from moving to the side surface of the light emitting device 120 and also may be prevented from being electrically short-circuited to improve the light extraction efficiency.

Meanwhile, in the light emitting device package 100 according to the embodiment, when the light emitting device 120 is fixed to the first package body 113 by the first and second resins 130 and 133, the upper regions of the first and second openings TH1 and TH2 may be sealed by the lower surfaces of the first and second bonding parts 121 and 122.

As described above, when the first and second openings TH1 and TH2 are sealed by the lower surfaces of the first and second bonding parts 121 and 122, the third resin 135 may not be provided and the first and second conductive layers 321 and 322 can be prevented from being diffused and moved to the regions around the first and second bonding parts 121 and 122.

In addition, according to the light emitting device package 100 of the embodiment, since the first resin 130 is disposed between the first and second bonding parts 121 and 122, electrical short circuit between the first and second bonding parts 121 and 122 can be prevented.

Accordingly, according to the embodiment, the width W3 between the first and second bonding parts 121 and 122 can be set small. According to the conventional light emitting device 120, the interval between the first and second bonding parts 121 and 122 may be set to several hundreds of micrometers to prevent an electrical short circuit.

However, according to the light emitting device package 100 of the embodiment, it is possible to prevent electrical short circuit between the first and second bonding parts 121 and 122 due to the first resin 130, so the width W3 between the first and second bonding parts 121 and 122 may be set to several tens of micrometers.

The width W3 between the first and second bonding parts 121 and 122 may be set to equal to or smaller than one hundred micrometers. For example, the width W3 between the first and second bonding parts 121 and 122 may be set to 40 micrometers to 80 micrometers. For example, the width W3 between the first and second bonding parts 121 and 122 may be selected from 50 micrometers to 60 micrometers.

Since the gap between the first and second bonding parts 121 and 122 of the light emitting device 120 can be provided to be reduced, there is an advantage that the size of the light emitting device package 100 can be reduced.

Next, a method of manufacturing a light emitting device package according to an embodiment of the present invention will be described with reference to FIGS. 4 to 8.

In description of the semiconductor device according to an embodiment with reference to FIG. 8, the description overlapping with those described with reference to FIGS. 1 and 3 may be omitted.

First, according to a method of manufacturing the light emitting device package according to an embodiment of the present invention, as illustrated in FIG. 4, a support frame B and a plurality of first body arrays A1, A2, A3, and A4 disposed in the support frame B may be provided.

The support frame B may stably support the plurality of first body arrays A1, A2, A3, and A4. The support frame B may be provided as an insulation frame or a conductive frame.

For example, the plurality of first body arrays A1, A2, A3, and A4 may be formed through an injection process or the like.

FIG. 4 illustrates a case in which four first body arrays A1, A2, A3, and A4 are disposed on the support frame B, but the plurality of first body arrays may be provided in three or less or provided in five or more. Also, the plurality of first body arrays may be arranged in a shape having a plurality of rows and a plurality of columns or may be arranged in a shape having one row and a plurality of columns.

Each of the plurality of first body arrays A1, A2, A3, and A4 may comprise a plurality of sub body arrays A11, A12, . . . .

[Each of the sub body arrays A11, A12, . . . , may comprise the first package body 113, the first to third openings TH1, TH2, and TH3 as described with reference to FIGS. 1 to 3. Also, each of the sub body arrays A11, A12, . . . may have a structure similar to each other.

The first opening TH1 may be provided in the first package body 113. The first opening TH1 may be provided to pass through the first package body 113. The first opening TH1 may be provided to pass through the top and lower surfaces of the first package body 113 in a first direction.

The second opening TH2 may be provided in the first package body 113. The second opening TH2 may be provided to pass through the first package body 113. The second opening TH2 may be provided to pass through the top and lower surfaces of the first package body 113 in the first direction.

The first opening TH1 and the second opening TH2 may be spaced apart from each other.

The third opening TH3 may be provided in the first package body 113. The third opening TH3 may be provided passing through the first package body 113. The third opening TH3 may be provided passing through the upper surface and the lower surface of the first package body 113 in a first direction. The third opening TH3 may be disposed between the first opening TH1 and the second opening TH2.

Meanwhile, according to the method of manufacturing the light emitting device package of the embodiment, the light emitting device 120 may be provided as shown in FIG. 5.

The light emitting device 120 according to the embodiment may comprise the first and second bonding parts 121 and 122, the light emitting structure 123, and the substrate 124, as described with reference to FIGS. 1 to 3. A first resin 130 may be provided between the first and second bonding parts 121 and 122.

The first resin 130 may be disposed between the first and second bonding parts 121 and 122 and may be disposed in contact with the side surfaces of the first and second bonding parts 121 and 122. In addition, a portion of the first resin 130 may be disposed in contact with the lower surface of the first bonding part 121. Another portion of the first resin 130 may be disposed in contact with the lower surface of the second bonding part 122.

Next, according to the method of manufacturing the light emitting device package of the embodiment, as shown in FIG. 6, the light emitting devices 120 may be disposed in each of the sub body arrays A11, A12, . . . .

As described with reference to FIGS. 1 to 3, a second resin 133 may be provided in the third opening TH3 and the light emitting device 120 may be mounted.

The second resin 133 may be provided in the third opening TH3 through a dotting method or the like.

For example, the second resin 133 may be provided in the third opening TH3 in a state where a supporting substrate or a supporting sheet is provided under the plurality of first body arrays A1, A2, A3, and A4. After the second resin 133 is cured, the supporting substrate or the supporting sheet may be removed.

Then, the light emitting device 120 may be provided on the first package body 113.

The light emitting device 120 may be fixed to the first package body 113 by the second resin 133. A portion of the second resin 133 provided in the third opening TH3 may be moved toward the first bonding part 121 and the second bonding part 122 to be cured. Accordingly, the second resin 133 may be provided between the lower surface of the light emitting device 120 and the upper surface of the first package body 113, and a stable fixing force can be provided between the light emitting device 120 and the first package body 113 113.

According to an embodiment, the first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first package body 113.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the first package body 113.

The upper surface of the second resin 133 may be disposed in contact with the lower surface of the first resin 130. The upper surface of the second resin 133 may be disposed in contact with the lower surface of the first bonding part 121. The upper surface of the second resin 133 may be disposed in contact with the lower surface of the second bonding part 122. The side surface of the second resin 133 may be disposed in contact with the side surface of the first package body 113 in the third opening TH3.

The second resin 133 may provide a stable fixing force between the first package body 113 and the light emitting device 120. The second resin 133 may provide a stable fixing force between the first package body 113 and the first and second bonding parts 121 and 122.

Next, according to the method of manufacturing the light emitting device package according to an embodiment, as described with reference to FIGS. 1 to 3, the first and second conductive layers 321 and 322 may be formed in the first and second openings TH1 and TH2 of the sub body arrays A11, A12, . . . , respectively. The first conductive layer 321 may be provided in the first opening TH1. The first conductive layer 321 may be disposed under the first bonding part 121. A width of the first conductive layer 321 may be less than the width of the first bonding part 121.

The first bonding part 121 may have a width in a second direction perpendicular to the first direction in which the first opening TH1 is formed. The width of the first bonding part 121 may be provided to be greater than a width of the first opening TH1 in the second direction.

The first conductive layer 321 may be disposed to directly contact the lower surface of the first bonding part 121. The first conductive layer 321 may be electrically connected to the first bonding part 121. The first conductive layer 321 may be disposed to be surrounded by the first package body 113.

The second conductive layer 322 may be provided in the second opening TH2. The second conductive layer 322 may be disposed under the second bonding part 122. A width of the second conductive layer 322 may be provided to be less than the width of the second bonding part 122.

The second bonding part 122 may have a width in the second direction perpendicular to the first direction in which the second opening TH2 is formed. The width of the second bonding part 122 may be provided to be greater than the width of the second opening TH2 in the second direction.

The second conductive layer 322 may be disposed to directly contact the lower surface of the second bonding part 122. The second conductive layer 322 may be electrically connected to the second bonding part 122. The second conductive layer 322 may be disposed to be surrounded by the first package body 113.

The first conductive layer 321 and the second conductive layer 322 may comprise at least one material selected from a group including Ag, Au, Pt, Sn, and Cu, or an alloy thereof. However, the present invention is not limited thereto, and a material capable of securing a conductive function may be used as each of the first conductive layer 321 and the second conductive layer 322.

For example, each of the first conductive layer 321 and the second conductive layer 322 may be formed using a conductive paste. The conductive paste may comprise a solder paste, a silver paste, and the like and may be provided as a multilayer that is formed of different materials or a multilayer or single layer formed of an alloy. For example, each of the first conductive layer 321 and the second conductive layer 322 may comprise a Sn—Ag—Cu (SAC) material.

In addition, as described with reference to FIGS. 1 to 3, according to the method of manufacturing the light emitting device package of the embodiment, after the third resin 135 is additionally formed between the first and second bonding parts 121 and 122, and the first package body 113, the first and second conductors 321 and 322 may be formed.

Meanwhile, according to the method of manufacturing the light emitting device package of the embodiment, as illustrated in FIG. 7, a second body array D may be provided.

The second body array D may comprise a plurality of sub body arrays E11, E12, . . . . For example, as illustrated in FIG. 7, the second body array D may comprise a plurality of sub body arrays E11, E12, . . . that are arranged in one direction. Also, the second body array D may comprise a plurality of sub body arrays E11, E12, . . . , having a matrix shape arranged in a plurality of rows and a plurality of columns.

As illustrated in FIG. 7, each of the plurality of sub body arrays E11, E12, . . . may comprise an opening passing through in a direction from an upper surface to a lower surface thereof.

Next, according to the method of manufacturing the light emitting device package of the embodiment, as illustrated in FIG. 8, the second body array D may be provided on the first body array A1, A2, A3, and A4.

The first body arrays A1, A2, A3, and A4 and the second body array D may be bonded through the adhesion layer 160, as described with reference to FIGS. 1 to 3.

For example, the sub body array E11 may be disposed on the sub body array A11, and the sub body array E12 may be disposed on the sub body array A12.

Meanwhile, in an embodiment, the first body arrays A1, A2, A3, and A4 and the second body array D may comprise different materials. For example, the first body arrays A1, A2, A3, and A4 and the second body array D may be formed of different materials in different processes and then bonded to each other through the adhesion layer 160.

The adhesion layer 160 may be disposed between the first body arrays A1, A2, A3, and A4 and the second body array D. The adhesion layer 160 may be disposed on an upper surface of each of the first body arrays A1, A2, A3, and A4. The adhesion layer 160 may be disposed on a lower surface of the second body array D.

The adhesion layer 160 may comprise at least one of an epoxy-based material, a silicone-based material, or a hybrid material including the epoxy-based material and the silicone-based material. Also, the adhesion layer 160 may reflect light emitted from the light emitting device 120. When the adhesion layer 160 has a reflective function, the adhesive may comprise white silicone.

Meanwhile, each of the first body arrays A1, A2, A3, and A4 and the second body array D may comprise at least one selected from resin materials including polyphthalamide (PPA), polychloro triphenyl (PCT), a liquid crystal polymer (LCP), polyamide9T (PA9T), and silicone, an epoxy molding compound (EMC), a silicone molding compound (SMC), polyimide (PI), and the like, as a base material.

Also, each of the first body arrays A1, A2, A3, and A4 and the second body array D may comprise at least one of a reflective material or a wavelength conversion material. Also, the first body arrays A1, A2, A3, and A4 and the second body array D may not comprise the reflective material and the wavelength conversion material.

The first body arrays A1, A2, A3, and A4 and the second body array D may comprise different base materials.

For example, the first body arrays A1, A2, A3, and A4 may comprise the reflective material, and the second body array D may comprise the wavelength conversion material. Also, the first body arrays A1, A2, A3, and A4 may comprise the wavelength conversion material, and the second body array D may comprise the reflective material.

According to an embodiment, the first body arrays A1, A2, A3, and A4 may comprise the reflective material, and the second body array D may comprise the reflective material and the wavelength conversion material. Also, the first body arrays A1, A2, A3, and A4 may comprise the reflective material and the wavelength conversion material, and the second body array D may comprise the wavelength conversion material.

In the light emitting device package according to an embodiment, the first body arrays A1, A2, A3, and A4 and the second body array D including different base materials are separately formed in different processes and then be manufactured in a modular manner through an optional combination that is capable of satisfying characteristics required for the application product.

Next, a fourth resin 140 may be formed in the cavity provided by the opening of the second body array D, as described with reference to FIGS. 1 to 3.

The fourth resin 140 may be provided on the light emitting device 120. The fourth resin 140 may be disposed on the first body arrays A1, A2, A3, and A4. The fourth resin 140 may be disposed in the cavity C provided by the second body array D.

The fourth resin 140 may comprise an insulation material. Also, the fourth resin 140 may comprise a wavelength conversion material that receives light emitted from the light emitting device 120 to provide light of which a wavelength is converted. For example, the fourth resin 140 may comprise a phosphor, a quantum dot, and the like.

Next, according to the method of manufacturing the light emitting device package of the embodiment, in the state in which the first body arrays A1, A2, A3, and A4 and the second body array D are bonded to each other, an individual light emitting device package may be manufactured through a separation process such as dicing or scribing as illustrated in FIG. 1.

As illustrated in FIG. 1, the light emitting device package 100 according to an embodiment may comprise a package body in which a first package body 113 and a second package body 117 are manufactured to be bonded to each other in a modular manner.

In the light emitting device package 100 according to an embodiment, as described above with reference to FIGS. 1 to 8, while the package body 110 is formed, a lead frame according to the related art is not applied.

In the case of the light emitting device package to which the lead frame according to the related art is applied, a process of forming the lead frame is additionally required, but the method of manufacturing the light emitting device package according to an embodiment of the present invention does not require the process of forming the lead frame. As a result, the method of manufacturing the light emitting device package according to an embodiment of the present invention has an advantage in reducing a process time and material.

Also, in the case of the light emitting device package to which the lead frame according to the related art is applied, a plating process using silver plating or the like has to be added to prevent the lead frame from being deteriorated. However, according to the method of manufacturing the light emitting device package of an embodiment of the present invention, since the lead frame is not required, the addition process such as the silver plating is not required. As described above, the method of manufacturing the light emitting device package according to an embodiment of the present invention may have an advantage in reducing manufacturing costs and improving manufacturing yield.

Also, there is an advantage that may be miniaturized when compared to the light emitting device package to which the lead frame according to the related art is applied.

In the light emitting device package 100 according to an embodiment, a power may be connected to the first bonding part 121 through the first conductive layer 321 provided in the first opening TH1, and also, a power may be connected to the second bonding part 122 through the second conductive layer 322 provided in the second opening TH2.

Accordingly, the light emitting device 120 may be driven by driving power supplied through the first bonding part 121 and the second bonding part 122. Also, light emitted from the light emitting device 120 may be provided in an upper direction of the package body 110.

Meanwhile, the light emitting device package 100 according to an embodiment described above may be provided to be mounted on a submount or a circuit board.

However, when the light emitting device package is mounted on the submount or the circuit board, a high temperature process such as a reflow process or a heat treatment process may be applied. Here, in the reflow or heat treatment process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of an embodiment, the first bonding part 121 and the second bonding part 122 of the light emitting device 120 according to an embodiment may receive the driving power through the first and second conductive layers 321 and 322. Also, a melting point of each of the first and second conductive layers 321 and 322 may be selected to have a higher value than a melting point of the general bonding material.

Accordingly, the light emitting device package 100 according to an embodiment does not cause the re-melting phenomenon even when bonded to a main substrate through the reflow process, and thus, the electrical connection and the physical bonding force may not be degraded.

Also, according to the light emitting device package 100 and the method of manufacturing the light emitting device package of an embodiment, since the light emitting device 120 is mounted on the first body arrays A1, A2, A3, and A4 by using the conductive paste, in the process of manufacturing the light emitting device package, the package body 110 does not need to be exposed to a high temperature. Therefore, according to an embodiment, the package body 110 may be prevented from being damaged or discolored due to the exposure at the high temperature.

For example, the package body 110 may comprise at least one material selected from a group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

Next, another example of the light emitting device package according to an embodiment of the present invention will be described with reference to FIG. 9. FIG. 9 is a view illustrating another example of the light emitting device package according to an embodiment of the present invention.

In the light emitting device package of FIG. 9 according to an embodiment of the present invention, an example in which the light emitting device package 100 described with reference to FIGS. 1 to 8 is mounted on a circuit board 310 will be described.

In the description of the light emitting device package according to an embodiment of the present invention with reference to FIG. 9, descriptions overlapping with those described with reference to FIGS. 1 to 8 may be omitted.

As illustrated in FIG. 9, the light emitting device package according to an embodiment may comprise a circuit board 310, a package body 110, and a light emitting device 120.

The circuit board 310 may comprise a first pad 311, a second pad 312, and a support substrate 313. A power supply circuit controlling driving of the light emitting device 120 may be provided on the support substrate 313.

The package body 110 may be disposed on the circuit board 310. The first pad 311 and the first bonding part 121 may be electrically connected to each other. The second pad 312 and the second bonding part 122 may be electrically connected to each other.

Each of the first pad 311 and the second pad 312 may comprise a conductive material. For example, each of the first pad 311 and the second pad 312 may comprise at least one material selected from the group including Ti, Cu, Ni, Au, Cr, Ta, Pt, Sn, Ag, P, Fe, Sn, Zn, and Al, or an alloy thereof. Each of the first pad 311 and the second pad 312 may be provided in a single layer or multiple layers.

The package body 110 may comprise a first package body 113 and a second package body 117.

The package body 110 may comprise a first opening TH1 and a second opening TH2 passing through from an upper surface to a lower surface thereof in the first direction. The first opening TH1 and the second opening TH2 may pass through from the upper surface to the lower surface of the first package body 113 in the first direction.

Meanwhile, according to an embodiment, the first package body 113 and the second package body 117 may comprise different materials. For example, the first package body 113 and the second package body 117 may be bonded to each other through an adhesion layer 160 after being formed of different materials in different processes.

The adhesion layer 160 may be disposed between the first package body 113 and the second package body 117. The adhesion layer 160 may be disposed on the upper surface of the first package body 113. The adhesion layer 160 may be disposed on the lower surface of the second package body 117. The adhesion layer 160 may be disposed around the light emitting device 120 to provide the cavity.

The adhesion layer 160 may comprise at least one of an epoxy-based material, a silicone-based material, or a hybrid material including the epoxy-based material and the silicone-based material. Also, the adhesion layer 160 may reflect light emitted from the light emitting device 120.

When the adhesion layer 160 may have reflective function, the adhesive may comprise white silicone.

Each of the first package body 113 and the second package body 117 may comprise at least one selected from resin materials including polyphthalamide (PPA), polychloro triphenyl (PCT), a liquid crystal polymer (LCP), polyamide9T (PA9T), a silicone, an epoxy molding compound (EMC), a silicone molding compound (SMC), polyimide (PI), and the like, as a base material.

I Also, each of the first package body 113 and the second package body 117 may comprise at least one of the reflective material or the wavelength conversion material. Also, the first package body 113 and the second package body 117 may not comprise the reflective material and the wavelength conversion material.

The first package body 113 and the second package body 117 may comprise different base materials.

For example, the first package body 113 may comprise a reflective material and the second package body 117 may comprise a wavelength conversion material. Also, the first package body 113 may comprise the wavelength conversion material, and the second package body 117 may comprise the reflective material.

According to an embodiment, the first package body 113 may comprise the reflective material, and the second package body 117 may comprise the reflective material and the wavelength conversion material. Also, the first package body 113 may comprise the reflective material and the wavelength conversion material, and the second package body 117 may comprise the wavelength conversion material.

In the light emitting device package 100 according to the embodiment, the first package body 113 and the second package body 117 including different base materials may be formed separately in different processes and then be manufactured in a modular manner through an optional combination that is capable of satisfying characteristics required for the application product.

The light emitting device 120 may comprise a first bonding part 121, a second bonding part 122, a light emitting structure 123, and a substrate 124.

The light emitting device 120 may be disposed on the package body 110. The light emitting device 120 may be disposed on the first package body 113. The light emitting device 120 may be disposed in a cavity C provided by the second package body 117.

The first bonding part 121 may be disposed on the lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed between the light emitting structure 123 and the first package body 113. The second bonding part 122 may be disposed between the light emitting structure 123 and the first package body 113.

The first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first package body 113.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the first package body 113.

The first opening TH1 and the second opening TH2 may be spaced apart from each other. The first opening TH1 and the second opening TH2 may be spaced apart from each other under the lower surface of the light emitting device 120.

The light emitting device package 100 according to the embodiment may comprise a third opening TH3, as shown in FIG. 9.

The third opening TH3 may be provided in the first package body 113. The third opening TH3 may be provided passing through the first package body 113. The third opening TH3 may be provided passing through the upper surface and the lower surface of the first package body 113 in a first direction.

The third opening TH3 may be disposed under the light emitting device 120. The third opening TH3 may be provided between the first opening TH1 and the second opening TH2. The third opening TH3 may be provided spaced apart from the first opening TH1. The third opening TH3 may be provided spaced apart from the second opening TH2.

A portion of the third opening TH3 may be provided to overlap with the first bonding part 121 of the light emitting device 120. A portion of the third opening TH3 may be provided to overlap with the first bonding part 121 of the light emitting device 120 in a first direction toward the lower surface from the upper surface of the first package body 113.

Also, a portion of the third opening TH3 may be provided to overlap with the second bonding part 122 of the light emitting device 120. A portion of the third opening TH3 may be provided to overlap with the second bonding part 122 of the light emitting device 120 in a first direction toward the lower surface from the upper surface of the first package body 113.

As illustrated in FIG. 9, the light emitting device package according to an embodiment may comprise a first conductive layer 321 and a second conductive layer 322.

The first conductive layer 321 may be disposed in the first opening TH1. The first conductive layer 321 may be disposed to directly contact the lower surface of the first bonding part 121. The first conductive layer 321 may be provided to overlap the first bonding part 121 in a vertical direction.

An upper surface of the first conductive layer 321 may be disposed on the same plane as the upper surface of the first package body 113. A lower surface of the first conductive layer 321 may be provided on the same plane as the lower surface of the first package body 113.

The second conductive layer 322 may be disposed in the second opening TH2. The second conductive layer 322 may be disposed to directly contact the lower surface of the second bonding part 122. The second conductive layer 322 may be provided to overlap the second bonding part 122 in the vertical direction.

An upper surface of the second conductive layer 322 may be disposed on the same plane as the upper surface of the first package body 113. A lower surface of the second conductive layer 322 may be provided on the same plane as the lower surface of the first package body 113.

For example, each of the first conductive layer 321 and the second conductive layer 322 may comprise at least one material selected from the group including Ag, Au, Pt, Sn, and Cu, or an alloy thereof.

The light emitting device package according to an embodiment may comprise a metal layer 430, as illustrated in FIG. 9.

The metal layer 430 may be disposed under the first and second conductive layers 321 and 322. The metal layer 430 may be disposed on the lower surfaces of the first and second conductive layers 321 and 322. Also, according to an embodiment, the metal layer 430 may be provided on the lower surface of the first package body 113 adjacent to the first and second openings TH1 and TH2.

The metal layer 430 may be formed of at least one material selected from the group including titanium (Ti), copper (Cu), nickel (Ni), gold (Au), chromium (Cr), tantalum (Ta), platinum (Pt), tin (Sn), silver (Ag), and phosphorus (P), or an optional alloy thereof.

According to an embodiment, the first pad 311 and the first conductive layer 321 of the circuit board 310 may be electrically connected to each other by the metal layer 430. Also, the second pad 312 and the second conductive layer 322 of the circuit board 310 may be electrically connected to each other by the metal layer 430.

The light emitting device package according to an embodiment may comprise a first resin 130, as illustrated in FIG. 9.

The first resin 130 may be disposed between the first bonding part 121 and the second bonding part 122. The first resin 130 may be disposed in contact with a side surface of the first bonding part 121. The first resin 130 may be disposed in contact with a side surface of the second bonding part 122. The first resin 130 may be disposed in contact with the lower surface of the light emitting structure 123 between the first bonding part 121 and the second bonding part 122.

The first resin 130 may prevent an electrical short circuit between the first bonding part 121 and the second bonding part 122. The first resin 130 may comprise an insulating material.

For example, the first resin 130 may comprise at least one of an epoxy-based material, a silicone-based material, and a hybrid material including an epoxy-based material and a silicone-based material.

The upper surface of the first resin 130 may be disposed in contact with the lower surface of the light emitting structure 123. One side surface of the first resin 130 may be disposed in contact with a side surface of the first bonding part 121. The other side surface of the first resin 130 may be disposed in contact with a side surface of the second bonding part 122.

The lower surface of the first resin 130 may be disposed lower than the lower surfaces of the first and second bonding parts 121 and 122. A portion of the first resin 130 may be disposed in contact with the lower surface of the first bonding part 121. A portion of the first resin 130 may be disposed in contact with the lower surface of the second bonding part 122.

The lower surface of the first resin 130 may be disposed lower than the upper surface of the first package body 113. The first resin 130 may be provided to overlap with the third opening TH3 in the first direction.

The light emitting device package 100 according to the embodiment may comprise a second resin 133 as shown in FIG. 9.

The second resin 133 may be provided in the third opening TH3. The second resin 133 may be disposed between the first opening TH1 and the second opening TH2. The second resin 133 may be disposed under the first resin 130.

The upper surface of the second resin 133 may be disposed in contact with the lower surface of the first resin 130. The upper surface of the second resin 133 may be disposed in contact with the lower surface of the first bonding part 121. The upper surface of the second resin 133 may be disposed in contact with the lower surface of the second bonding part 122. The side surface of the second resin 133 may be disposed in contact with the side surface of the first package body 113 in the third opening TH3.

The second resin 133 may provide a stable fixing force between the first package body 113 and the light emitting device 120. The second resin 133 may provide a stable fixing force between the first package body 113 and the first and second bonding parts 121 and 122.

In addition, the light emitting device package 100 according to the embodiment may comprise a third resin 135 as shown in FIG. 9.

The third resin 135 may be disposed around the first bonding part 121. The third resin 135 may seal the upper region of the first opening TH1 together with the first resin 130. The third resin 135 may be disposed around the second bonding part 122. The third resin 135 may seal the upper region of the second opening TH1 together with the first resin 130.

The third resin 135 may provide a stable fixing force between the light emitting device 120 and the first package body 113. The third resin 135 may be disposed in direct contact with the upper surface of the first package body 113, for example. In addition, the third resin 135 may be disposed in direct contact with the lower surface of the light emitting device 120.

In addition, the light emitting device package according to the embodiment may comprise a fourth resin 140 as shown in FIG. 9.

The fourth resin 140 may be provided on the light emitting device 120. The fourth resin 140 may be disposed on the first package body 113. The fourth resin 140 may be disposed in the cavity C provided by the second package body 117.

In addition, according to the light emitting device package 100 of the embodiment, since the first resin 130 is disposed between the first and second bonding parts 121 and 122, electrical short circuit between the first and second bonding parts 121 and 122 can be prevented.

Accordingly, according to the embodiment, the width W3 between the first and second bonding parts 121 and 122 can be set small. According to the conventional light emitting device 120, the interval between the first and second bonding parts 121 and 122 may be set to several hundreds of micrometers to prevent an electrical short circuit.

However, according to the light emitting device package 100 of the embodiment, it is possible to prevent electrical short circuit between the first and second bonding parts 121 and 122 due to the first resin 130, so the width W3 between the first and second bonding parts 121 and 122 may be set to several tens of micrometers.

The width W3 between the first and second bonding parts 121 and 122 may be set to equal to or smaller than 100 micrometers. For example, the width W3 between the first and second bonding parts 121 and 122 may be set to 40 micrometers to 80 micrometers. For example, the width W3 between the first and second bonding parts 121 and 122 may be selected from 50 micrometers to 60 micrometers.

As described above, according to the embodiment, since the gap between the first and second bonding parts 121 and 122 of the light emitting device 120 can be reduced, there is an advantage that the size of the light emitting device package 100 can be reduced.

In the light emitting device package according to the embodiment, as described with reference to FIG. 9, the conventional lead frame is not applied in forming the package body 110.

In the case of a light emitting device package to which a conventional lead frame is applied, a process of forming a lead frame is further required. However, in the method of manufacturing the light emitting device package according to an embodiment of the present invention, a process of forming a lead frame is not required. Thus, according to the method of manufacturing the light emitting device package of the embodiment of the present invention, there are advantage that not only the process time is shortened but also the material is also reduced.

In addition, in the case of the light emitting device package to which the lead frame according to the related art is applied, a plating process using silver plating or the like has to be added to prevent the lead frame from being deteriorated. However, according to the light emitting device package according to an embodiment of the present invention, since the lead frame is not required, the addition process such as the silver plating is not required. Accordingly, embodiments of the light emitting device package may solve the problem of discoloration of the material such as silver plating and may reduce manufacturing costs due to the advantage in which the process is omitted. Therefore, the method of manufacturing the light emitting device package according to an embodiment of the present invention may have an advantage in reducing manufacturing costs and improving manufacturing yield and product reliability.

In addition, there is an advantage that may be miniaturized when compared to the light emitting device package to which the lead frame according to the related art is applied.

In the light emitting device package 100 according to an embodiment, a power may be connected to the first bonding part 121 through the first conductive layer 321 provided in the first opening TH1, and also, a power may be connected to the second bonding part 122 through the second conductive layer 322 provided in the second opening TH2.

Accordingly, the light emitting device 120 may be driven by driving power supplied through the first bonding part 121 and the second bonding part 122. Also, light emitted from the light emitting device 120 may be provided in an upper direction of the package body 110.

Meanwhile, the light emitting device package 100 according to an embodiment described above may be provided to be mounted on a submount or a circuit board.

However, when the light emitting device package according to the related art is mounted on the submount or the circuit board, a high temperature process such as a reflow process may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package according to an embodiment, the first bonding part 121 and the second bonding part 122 of the light emitting device 120 according to an embodiment may receive the driving power through the first and second conductive layers 321 and 322. Also, a melting point of each of the first and second conductive layers 321 and 322 may be selected to have a higher value than a melting point of the general bonding material.

Accordingly, the light emitting device package 100 according to an embodiment does not cause the re-melting phenomenon even when bonded to a main substrate through the reflow process, and thus, the electrical connection and the physical bonding force may not be degraded.

Also, according to the light emitting device package 100 and the method of manufacturing the light emitting device package according to an embodiment, since the light emitting device 120 is mounted on the first body arrays A1, A2, A3, and A4 by using the conductive paste, in the process of manufacturing the light emitting device package, the package body 110 does not need to be exposed to a high temperature. Therefore, according to an embodiment, the package body 110 may be prevented from being damaged or discolored due to the exposure at the high temperature.

For example, the package body 110 may comprise at least one material selected from the group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

Meanwhile, in the case of the light emitting device package according to the embodiment described above, it was described based on the case that one opening is provided under each bonding portion.

However, according to the light emitting device package according to another embodiment, a plurality of openings may be provided under each opening. Further, the plurality of openings may be provided as openings having different widths.

In addition, the shape of the opening according to the embodiment may be provided in various shapes.

For example, the opening according to the embodiment may be provided with the same width from the upper region to the lower region.

Also, the opening according to the embodiment may be provided in a multi-step structure. For example, the openings may be provided in a shape having a different inclination angle of the two-step structure. Further, the openings may be provided in a shape having different inclination angles of three or more step structure.

Further, the opening may be provided in a shape in which the width changes from the upper region to the lower region. As an example, the opening may be provided in a shape having a curvature from the upper region to the lower region.

In addition, according to the light emitting device package according to the embodiment, the package body 110 may be provided so as to include only the first package body 113 having a flat upper surface, and not including the second package body 117 disposed on the first package body 113.

Next, another example of the light emitting device package according to the embodiment will be described with reference to FIGS. 10 to 12.

FIG. 10 is a view illustrating still another example of a light emitting device package according to an embodiment of the present invention, FIG. 11 is a view explaining the arrangement relationship of an opening and a light emitting device of the light emitting device package shown in FIG. 10, and FIG. 12 is a bottom view of the light emitting device package shown in FIG. 10.

In the description of the light emitting device package according to an embodiment with reference to FIGS. 10 to 12, descriptions overlapping with those described with reference to FIGS. 1 to 9 may be omitted.

The light emitting device package according to an embodiment may comprise a package body 110 and a light emitting device 120, as illustrated in FIGS. 10 to 12.

The package body 110 may comprise a first package body 113 and a second package body 117. The second package body 117 may be disposed on the first package body 113. The second package body 117 may be disposed around an upper surface of the first package body 113. The second package body 117 may provide a cavity C in the upper surface of the first package body 113. The second package body 117 may comprise an opening passing through the upper and lower surfaces thereof.

In other words, the first package body 113 may be referred to as a lower body, and the second package body 117 may be referred to as an upper body. Also, according to an embodiment, the package body 110 may not include the second package body 117 that provides the cavity but may comprise only the first package body 113 that provides a flat upper surface.

The second package body 117 may reflect light emitted from the light emitting device 120 in an upward direction. The second package body 117 may be disposed to be inclined with respect to the upper surface of the first package body 113.

The package body 110 may comprise the cavity C. The cavity may comprise a lower surface and a side surface inclined from the lower surface to the upper surface of the package body 110.

According to an embodiment, the package body 110 may have a structure having the cavity C or may have a structure having a flat upper surface without the cavity C.

The first package body 113 may comprise a first frame 111 and a second frame 112. The first frame 111 and the second frame 112 may be spaced apart from each other.

The first package body 113 may comprise a first body 115. The first body 115 may be disposed between the first frame 111 and the second frame 112. The first body 115 may perform a function of a kind of electrode separation line. The first body 115 may also be referred to as an insulation member.

The first body 115 may be disposed on the first frame 111. In addition, the first body 115 may be disposed on the second frame 112.

Each of the first frame 111 and the second frame 112 may be provided as an insulation frame. The first frame 111 and the second frame 112 may stably provide structural strength of the package body 110.

Also, each of the first frame 111 and the second frame 112 may be provided as a conductive frame. The first frame 111 and the second frame 112 may stably provide structural strength of the package body 110 and may be electrically connected to the light emitting device 120.

For example, the package body 110 may be formed of at least one selected from the group including polyphthalamide (PPA), polychloro triphenyl (PCT), a liquid crystal polymer (LCP), polyamide9T (PA9T), silicone, an epoxy molding compound (EMC), a silicone molding compound (SMC), ceramic, polyimide (PI), photo sensitive glass (PSG), sapphire ($Al_2O_3$), and the like. Also, the package body 110 may comprise a reflective material of a high refractive filler, such as $TiO_2$ and $SiO_2$. The package body 110 may comprise a wavelength conversion material such as a quantum dot and a phosphor.

According to an embodiment, the first package body 113 and the second package body 117 may comprise different materials. For example, the first package body 113 and the second package body 117 may be bonded to each other after being formed of different materials in different processes. For example, the first package body 113 and the second package body 117 may be bonded to each other through an adhesion layer 160.

The adhesion layer 160 may be disposed between the first package body 113 and the second package body 117. The adhesion layer 160 may be disposed on the upper surface of the first package body 113. The adhesion layer 160 may be disposed on the lower surface of the second package body 117. The adhesion layer 160 may be disposed around the light emitting device 120 to provide the cavity.

The adhesion layer 160 may comprise at least one of an epoxy-based material, a silicone-based material, or a hybrid material including the epoxy-based material and the silicone-based material. Also, the adhesion layer 160 may reflect light emitted from the light emitting device 120. When the adhesion layer 160 has a reflective function, the adhesion layer 160 may comprise white silicone.

Meanwhile, each of the first package body 115 and the second package body 117 may comprise at least one selected from resin materials including polyphthalamide (PPA), polychloro triphenyl (PCT), a liquid crystal polymer (LCP), polyamide9T (PA9T), a silicone, an epoxy molding compound (EMC), a silicone molding compound (SMC), polyimide (PI), and the like, as a base material.

In addition, each of the first body 115 and the second package body 117 may comprise at least one of the reflective material or the wavelength conversion material. Also, the first body 115 and the second package body 117 may not include the reflective material and the wavelength conversion material. Each of the first body 115 and the second package body 117 may be formed of a transparent resin.

The first body 115 and the second package body 117 may comprise different base materials. The first body 115 and the second package body 117 may comprise different resins.

For example, the first body 115 may comprise a reflective material and the second package body 117 may comprise a wavelength conversion material. Also, the first body 115 may comprise the wavelength conversion material, and the second package body 117 may comprise the reflective material.

According to an embodiment, the first body 115 may comprise the reflective material, and the second package body 117 may comprise the reflective material and the wavelength conversion material. Also, the first body 115 may comprise the reflective material and the wavelength conversion material, and the second package body 117 may comprise the wavelength conversion material.

In the light emitting device package according to the embodiment, the first package body 113 and the second package body 117 including different base materials may be formed separately in different processes and then be manufactured in a modular manner through an optional combination that is capable of satisfying characteristics required for the application product.

According to an embodiment, the light emitting device 120 may comprise a first bonding part 121, a second bonding part 122, a light emitting structure 123, and a substrate 124.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on the lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Meanwhile, the light emitting device package according to an embodiment may comprise the first opening TH1 and the second opening TH2 as shown in FIGS. 10 to 12. The first frame 111 may comprise the first opening TH1. The second frame 112 may comprise the second opening TH2.

For example, the first package body 113 may have a flat lower surface and may comprise an upper surface parallel to the lower surface. The first and second openings TH1 and TH2 may pass through the top and lower surfaces of the first package body 113.

The first opening TH1 may be provided in the first frame 111. The first opening TH1 may be provided to pass through the first frame 111. The first opening TH1 may be provided to pass through the upper and lower surfaces of the first frame 111 in the first direction.

The first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first frame 111.

The second opening TH2 may be provided in the second frame 112. The second opening TH2 may be provided to pass through the second frame 112. The second opening TH2 may be provided to pass through the top and lower surfaces of the second frame 112 in the first direction.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the second frame 112.

The first opening TH1 and the second opening TH2 may be spaced apart from each other. The first opening TH1 and the second opening TH2 may be spaced apart from each other below the lower surface of the light emitting device 120.

According to an embodiment, a width of an upper region of the first opening TH1 may be provided equal to or smaller than a width of the first bonding part 121. Also, a width of an upper region of the second opening TH2 may be provided equal to or smaller than a width of the second bonding part 122.

Accordingly, the first bonding part 121 of the light emitting device 120 and the first frame 111 can be more firmly attached. In addition, the second bonding part 122 of the light emitting device 120 and the second frame 112 can be more firmly attached.

In addition, the width W1 of the upper region of the first opening TH1 may be provided equal to or smaller than the width W2 of the lower region of the first opening TH1. Also, the width of the upper region of the second opening TH2 may be provided equal to or smaller than the width of the lower region of the second opening TH2.

The first opening TH1 may be provided in an inclined shape in which the width gradually decreases from the lower region to the upper region. The second opening portion TH2 may be provided in an inclined shape in which the width gradually decreases from the lower region to the upper region.

However, it is not limited thereto, and the inclined surfaces between the upper and lower regions of the first and second openings TH1 and TH2 may have a plurality of inclined surfaces having different slopes and the inclined surfaces may be arranged with a curvature.

The width between the first opening TH1 and the second opening TH2 in the lower surface region of the first frame 111 and the second frame 112 may be provided several hundreds of micrometers. The width between the first opening TH1 and the second opening TH2 in the lower surface region of the first frame 111 and the second frame 112 may be provided, for example, 100 micrometers to 150 micrometers.

The width between the first opening TH1 and the second opening TH2 in the lower surface region of the first frame 111 and the second frame 112 may be selected to be provided over a predetermined distance in order to prevent electrical short circuit between pads when the light emitting device package 100 according to the embodiment is later mounted on a circuit board, a sub-mount, or the like.

The light emitting device package according to the embodiment may comprise a third opening TH3, as shown in FIGS. 10 to 12.

The third opening TH3 may be provided in the first package body 113. The third opening TH3 may be provided passing through the first package body 113. The third opening TH3 may be provided passing through the upper surface and the lower surface of the first package body 113 in a first direction.

The third opening TH3 may be provided in the first body 115. The third opening TH3 may be provided passing through the first body 115. The third opening TH3 may be provided passing through the upper surface and the lower surface of the first body 115 in a first direction.

The third opening TH3 may be disposed under the light emitting device 120. The third opening TH3 may be provided between the first opening TH1 and the second opening TH2. The third opening TH3 may be provided spaced apart from the first opening TH1. The third opening TH3 may be provided spaced apart from the second opening TH2.

A portion of the third opening TH3 may be provided to overlap with the first bonding part 121 of the light emitting device 120. A portion of the third opening TH3 may be provided to overlap with the first bonding part 121 of the light emitting device 120 in a first direction toward the lower surface from the upper surface of the first package body 113.

Also, a portion of the third opening TH3 may be provided to overlap with the second bonding part 122 of the light emitting device 120. A portion of the third opening TH3 may be provided to overlap with the second bonding part 122 of the light emitting device 120 in a first direction toward the lower surface from the upper surface of the first package body 113.

The light emitting device package according to the embodiment may comprise a first resin 130.

The first resin 130 may be disposed between the first bonding part 121 and the second bonding part 122. The first resin 130 may be disposed in contact with a side surface of the first bonding part 121. The first resin 130 may be disposed in contact with a side surface of the second bonding part 122. The first resin 130 may be disposed in contact with the lower surface of the light emitting structure 123 between the first bonding part 121 and the second bonding part 122.

The first resin 130 may prevent an electrical short between the first bonding part 121 and the second bonding part 122. The first resin 130 may comprise an insulating material.

For example, the first resin 130 may comprise at least one of an epoxy-based material, a silicone-based material, and a hybrid material including an epoxy-based material and a silicone-based material.

In addition, the first resin 130 may reflect light emitted from the light emitting device 120. When the first resin 130 includes a reflection function, the first resin 130 may comprise white silicone. When the first resin 130 includes a reflection function, the first resin 130 may be formed of a material including, for example, $TiO_2$, $SiO_2$, and the like. The first resin 130 may be referred to as an adhesive.

The upper surface of the first resin 130 may be disposed in contact with the lower surface of the light emitting structure 123. One side surface of the first resin 130 may be disposed in contact with a side surface of the first bonding part 121. The other side surface of the first resin 130 may be disposed in contact with the side surface of the second bonding part 122.

The lower surface of the first resin 130 may be disposed lower than the lower surfaces of the first and second bonding parts 121 and 122. A portion of the first resin 130 may be disposed in contact with the lower surface of the first bonding part 121. A portion of the first resin 130 may be disposed in contact with the lower surface of the second bonding part 122.

The lower surface of the first resin 130 may be disposed lower than the upper surface of the first package body 113. The first resin 130 may be provided to overlap with the third opening TH3 in the first direction.

The light emitting device package according to the embodiment may comprise a second resin 133, as shown in FIG. 10.

The second resin 133 may be provided in the third opening TH3. The second resin 133 may be disposed between the first opening TH1 and the second opening TH2. The second resin 133 may be disposed under the first resin 130.

The upper surface of the second resin 133 may be disposed in contact with the lower surface of the first resin 130. The upper surface of the second resin 133 may be disposed in contact with the lower surface of the first bonding part 121. The upper surface of the second resin 133 may be disposed in contact with the lower surface of the second bonding part 122. The side surface of the second resin 133 may be disposed in contact with the side surface of the first package body 113 in the third opening TH3.

The second resin 133 may provide a stable fixing force between the first package body 113 and the light emitting device 120. The second resin 133 may provide a stable fixing force between the first package body 113 and the first and second bonding parts 121 and 122.

For example, the second resin 133 may comprise at least one of an epoxy-based material, a silicone-based material, and a hybrid material including an epoxy-based material and a silicone-based material.

In addition, the second resin 133 may reflect light emitted from the light emitting device 120. When the second resin 133 includes a reflection function, the second resin 133 may comprise white silicone. When the second resin 133 includes a reflection function, the second resin 133 may be formed of a material including $TiO_2$, $SiO_2$, and the like. The second resin 133 may be referred to as an adhesive.

In addition, the light emitting device package according to the embodiment may comprise a third resin 135 as shown in FIG. 10.

The third resin 135 may be disposed around the first bonding part 121. The third resin 135 may seal the upper region of the first opening TH1 together with the first resin 130. The third resin 135 may be disposed around the second bonding part 122. The third resin 135 may seal the upper region of the second opening TH1 together with the first resin 130.

The third resin 135 may provide a stable fixing force between the light emitting device 120 and the first package body 113. The third resin 135 may be disposed in direct contact with the upper surface of the first package body 113, for example. In addition, the third resin 135 may be disposed in direct contact with the lower surface of the light emitting device 120.

For example, the third resin 135 may comprise at least one of an epoxy-based material, a silicone-based material, and a hybrid material including an epoxy-based material and a silicone-based material. In addition, the first resin 130 may reflect light emitted from the light emitting device 120. When the third resin 135 includes a reflection function, the third resin 135 may comprise white silicone. When the third resin 135 includes a reflection function, the third resin 135 may be formed of a material including $TiO_2$, $SiO_2$, and the like. The third resin 135 may also be referred to as an adhesive.

In addition, the light emitting device package according to the embodiment may comprise a fourth resin 140, as shown in FIG. 10.

The fourth resin 140 may be provided on the light emitting device 120. The fourth resin 140 may be disposed on the first package body 113. The fourth resin 140 may be disposed in the cavity C provided by the second package body 117.

The fourth resin 140 may comprise an insulating material. Also, the fourth resin 140 may comprise a wavelength conversion material that receives light emitted from the light emitting device 120 and provides wavelength-converted light. For example, the fourth resin 140 may comprise a phosphor, a quantum dot, and the like.

In addition, the light emitting device package 100 according to the embodiment may comprise a first conductive layer 321 and a second conductive layer 322, as shown in FIGS. 10 to 12. The first conductive layer 321 may be spaced apart from the second conductive layer 322.

The first conductive layer 321 may be provided in the first opening TH1. The first conductive layer 321 may be disposed under the first bonding part 121. The width of the first conductive layer 321 may be provided smaller than the width of the first bonding part 121.

The first bonding part 121 may have a width in a second direction perpendicular to the first direction in which the first opening portion TH1 is formed. The width of the first bonding part 121 may be provided greater than the width of the first opening TH1 in the second direction.

The first conductive layer 321 may be disposed in direct contact with the lower surface of the first bonding part 121. The first conductive layer 321 may be electrically connected to the first bonding part 121. The first conductive layer 321 may be surrounded by the first frame 111.

The second conductive layer 322 may be provided in the second opening TH2. The second conductive layer 322 may be disposed under the second bonding part 122. The width of the second conductive layer 322 may be provided smaller than the width of the second bonding part 122.

The second bonding part 122 may have a width in a second direction perpendicular to the first direction in which the second opening portion TH2 is formed. The width of the second bonding part 122 may be provided greater than the width of the second opening TH2 in the second direction.

The second conductive layer 322 may be disposed in direct contact with the lower surface of the second bonding part 122. The second conductive layer 322 may be electrically connected to the second bonding part 122. The second conductive layer 322 may be disposed to be surrounded by the second frame 112.

The first conductive layer 321 and the second conductive layer 322 may comprise at least one material selected from a group including Ag, Au, Pt, Sn, Cu, and the like, or an alloy thereof. However, it is not limited thereto, and the first conductive layer 321 and the second conductive layer 322 may be formed of a material capable of ensuring a conductive function.

For example, the first conductive layer 321 and the second conductive layer 322 may be formed using a conductive paste. The conductive paste may comprise a solder paste, a silver paste, or the like, and may be provided as a multilayer that is formed of different materials or a multilayer or single layer formed of an alloy. For example, the first conductive layer 321 and the second conductive layer 322 may comprise a Sn—Ag—Cu (SAC) material.

In addition, the light emitting device package according to the embodiment may comprise a first lower recess R11 and a second lower recess R12 as shown in FIGS. 10 to 12. The first lower recess R11 and the second lower recess R12 may be spaced apart from each other.

The first lower recess R11 may be provided in a lower surface of the first frame 111. The first lower recess R11 may be recessed upward from the lower surface of the first frame 111. The first lower recess R11 may be spaced apart from the first opening TH1.

The first lower recess R11 may be provided to a width of several micrometers to several tens of micrometers. A resin part may be provided in the first lower recess R11. For example, the resin part filled in the first lower recess R11 may be formed of the same material as the first body 115.

However, the present invention is not limited thereto, and the resin part may be selected from materials having poor adhesion and wettability with respect to the first and second conductive layers 321 and 322. Alternatively, the resin part may be selected from a material having a low surface tension with respect to the first and second conductive layers 321 and 322.

For example, the resin part filled in the first lower recess R11 may be provided while the first frame 111, the second frame 112, and the first body 115 are formed through an injection process.

The resin part filled in the first lower recess R11 may be disposed around an area of a lower surface of the first frame 111 providing the first opening TH1. The area of the lower surface of the first frame 111 providing the first opening TH1 may be disposed separately from a lower surface in the vicinity of the first frame 111 in a kind of island shape.

For example, as shown FIG. 12, the lower surface region of the first frame 111 providing the first opening TH1 may be isolated from the first frame disposed at periphery by the resin part filled in the first lower recess R11 and the first body 115.

Therefore, when the resin part is formed of the material having the poor adhesion or wettability with respect to the first and second conductive layers 321 and 322 or the material having the low surface tension between the resin part and the first and second conductive layers 321 and 322, the first conductive layer 321 provided in the first opening TH1 may be prevented from being spread over the resin part filled in the first lower recess R11 or the first body 115 by moving away from the first opening TH1.

This is because of using the feature in which the adhesion relationship between the first conductive layer 321, the resin part, and the first body 115 or between the resin part and the first and second conductive layers 321 and 322 is poor. That is, the material forming the first conductive layer 321 may be selected to have good adhesive properties with respect to the first frame 111. Also, the material forming the first conductive layer 321 may be selected to have poor adhesive properties with respect to the resin part and the first body 115.

Accordingly, the first conductive layer 321 may be prevented from being spread to flow over the region provided by the resin part or the first body 115 by overflowing from the first opening TH1 to the region provided by the outside of the first resin part or the first body 115, and thus, the first conductive layer 321 may be stably disposed on the region in which the first opening TH1 is provided.

Therefore, when the first conductive layer 321 disposed in the first opening TH1 overflows, the first conductive layer 321 may be prevented from being expanded out of the region of the first lower recess R11, in which the resin part or the first body 115 is provided.

Also, the first conductive layer 321 may be stably connected to the lower surface of the first bonding part 121 in the first opening TH1. Therefore, when the light emitting device package is mounted on the circuit board, a problem in which the first conductive layer 321 and the second conductive layer 322 contact each other to cause electrical short circuit may be prevented, and in a process of locating the first and second conductive layers 321 and 322, an amount of each of the first and second conductive layers 321 and 322 may be easily controlled.

Also, the second lower recess R12 may be provided in a lower surface of the second frame 112. The second lower recess R12 may be recessed upward from the lower surface of the second frame 112. The second lower recess R12 may be spaced apart from the second opening TH2.

The second lower recess R12 may be provided to a width of several micrometers to several tens of micrometers. The resin part may be provided in the second lower recess R12. The resin part filled in the second lower recess R12 may be, for example, formed of the same material as the first body 115.

However, the present invention is not limited thereto, and the resin part may be selected from materials having poor adhesion and wettability with respect to the first and second conductive layers 321 and 322. Alternatively, the resin part may be selected from a material having a low surface tension with respect to the first and second conductive layers 321 and 322.

For example, the resin part filled in the second lower recess R12 may be provided while the first frame 111, the second frame 112, and the first body 115 are formed through an injection process.

The resin part filled in the second lower recess R12 may be disposed around an area of a lower surface of the second frame 112 providing the second opening TH2. The area of the lower surface of the second frame 112 providing the second opening TH2 may be disposed separately from a lower surface in the vicinity of the second frame 112 in a kind of island shape.

For example, as shown in FIG. 12, the lower surface region of the first frame 111 providing the first opening TH1 may be isolated from the first frame disposed at periphery by the resin part filled in the first lower recess R11 and the first body 115.

Therefore, when the resin part is formed of the material having the poor adhesion or wettability with respect to the first and second conductive layers 321 and 322 or the material having the low surface tension between the resin part and the first and second conductive layers 321 and 322, the second conductive layer 322 provided in the second opening TH2 may be prevented from being spread over the resin part filled in the second lower recess R12 or the first body 115 by moving away from the second opening TH2.

This is because of using the feature in which the adhesion relationship between the second conductive layer 322, the resin part, and the first body 115 or between the resin part and the first and second conductive layers 321 and 322 is poor. That is, the material forming the second conductive layer 322 may be selected to have good adhesive properties with respect to the second frame 112. Also, the material forming the second conductive layer 322 may be selected to have poor adhesive properties with respect to the resin part and the first body 115.

Accordingly, the second conductive layer 322 may be prevented from being spread to flow over the region provided by the resin part or the first body 115 by overflowing from the second opening TH2 to the region provided by the outside of the first resin part or the first body 115, and thus, the second conductive layer 322 may be stably disposed on the region in which the second opening TH2 is provided.

Therefore, when the second conductive layer 322 disposed in the second opening TH2 overflows, the second conductive layer 322 may be prevented from being expanded out of the region of the second lower recess R12, in which the resin part or the first body 115 is provided. Also, the second conductive layer 322 may be stably connected to the lower surface of the second bonding part 122 in the second opening TH2.

The first conductive layer 321 and the second conductive layer 322 can be prevented from being electrically short circuited by contacting each other when the light emitting device package is mounted on a circuit board, and the amount of the first and second conductive layers 321 and 322 can be very easily controlled in a process of disposing the first and second conductive layers 321 and 322.

According to the embodiment, the first conductive layer 321 may be electrically connected to the first bonding part 121 and the second conductive layer 322 may be electrically connected to the second bonding part 122. For example, external power may be supplied to the first conductive layer 321 and the second conductive layer 322, so that the light emitting device 120 may be driven.

The first resin 130 and the second resin 133 may function to stably fix the light emitting device 120 to the package body 110. Also, the third resin 133 may be disposed around the first and second bonding parts 121 and 122 in contact with the side surfaces of the first and second bonding parts 121 and 122. The third resin 133 may be disposed such that the first and second openings TH1 and TH2 are isolated from the outer region provided with the fourth resin 140 when viewed from the upper direction of the light emitting device 120.

By the third resin 133, the first and second conductive layers 321 and 322 provided in the first and second openings TH1 and TH2 can be prevented from flowing outward of the light emitting device 120.

When the first and second conductive layers 321 and 322 are moved in the outer direction of the light emitting device 120, when viewed from above the light emitting device 120, the first and second conductive layers 321 and 322 may be diffused on the side surface of the light emitting device 120. As described above, when the first and second conductive layers 321 and 322 are moved to the side surface of the light emitting device 120, the first conductivity type semiconductor layer and the second conductivity type semiconductor layer of the light emitting device 120 may be electrically short circuited. In addition, when the first and second conductive layers 321 and 322 are moved to the side surface of the light emitting device 120, the light extraction efficiency of the light emitting device 120 may be lowered.

However, according to the embodiment, since the peripheral regions of the first and second bonding parts 121 and 122 can be sealed by the first and third resins 130 and 133, the first and second conductive layers 321 and 322 can be prevented from moving outward beyond the first and second openings TH1 and TH2.

Therefore, according to the light emitting device package of the embodiment, the first and second conductive layers 321 and 322 can be prevented from moving to the side surface of the light emitting device 120, so electrical short can be prevented and the light extraction efficiency can be improved.

Meanwhile, in the light emitting device package according to the embodiment, when the light emitting device 120 is fixed to the first package body 113 by the first and second resins 130 and 133, the upper regions of the first and second openings TH1 and TH2 may be sealed by the lower surfaces of the first and second bonding parts 121 and 122.

When the first and second openings TH1 and TH2 are sealed by the lower surfaces of the first and second bonding parts 121 and 122 as described above, the third resin 135 may not be provided, and the first and second conductive layers 321 and 322 can be prevented from being diffused and moved to the regions around the first and second bonding parts 121 and 122.

In addition, according to the light emitting device package of the embodiment, since the first resin 130 is disposed between the first and second bonding parts 121 and 122, electrical short between the first and second bonding parts 121 and 122 can be prevented by the first resin 130.

Accordingly, according to the embodiment, the width W3 between the first and second bonding parts 121 and 122 can be set small. According to the conventional light emitting device 120, the interval between the first and second bonding parts 121 and 122 may be set to several hundreds of micrometers to prevent an electrical short circuit.

However, according to the light emitting device package of the embodiment, electrical short circuit between the first and second bonding parts 121 and 122 can be prevented by the first resin 130, so that the width W3 between the first and second bonding parts 121 and 122 may be set to several tens of micrometers.

The width W3 between the first and second bonding parts 121 and 122 may be set to equal to or smaller than 100 micrometers. For example, the width W3 between the first and second bonding parts 121 and 122 may be set to 40 micrometers to 80 micrometers. For example, the width W3 between the first and second bonding parts 121 and 122 may be selected from 50 micrometers to 60 micrometers.

As described above, according to the embodiment, since the interval between the first and second bonding parts 121 and 122 of the light emitting device 120 can be reduced, there is an advantage that the size of the light emitting device package can be reduced.

Meanwhile, the light emitting device package according to an embodiment described above may be provided to be mounted on a submount, a circuit board, or the like.

However, when the light emitting device package of the related art is mounted on the submount or the circuit board, a high temperature process such as a reflow, thermal treatment process, or the like, may be applied. Here, in the reflow process or the thermal treatment process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package according to an embodiment, the bonding part of the light emitting device according to an embodiment may receive driving power through the conductive layer disposed in the opening. Also, a melting point of the conductive layer disposed in the opening may be selected to have a higher value than that of the general bonding material.

Accordingly, the light emitting device package according to an embodiment does not cause the re-melting phenomenon even when bonded to a main substrate through the reflow process, and thus, the electrical connection and the physical bonding force may not be degraded.

Also, according to the light emitting device package and the method of manufacturing the light emitting device package according to the embodiment, the package body 110 does not need to be exposed to a high temperature in the process of manufacturing the light emitting device package. Therefore, according to an embodiment, the package body 110 may be prevented from being damaged or discolored due to the exposure at the high temperature.

Accordingly, the selection range for the material forming the first body 115 may be widened. According to an embodiment, the first body 115 may be provided using a relatively inexpensive resin material as well as an expensive material such as a ceramic.

For example, the first body 115 may comprise at least one material selected from the group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

Next, an example of a flip chip light emitting device applied to a light emitting device package according to an embodiment of the present invention will be described with reference to the accompanying drawings.

FIG. 13 is a view illustrating a light emitting device applied to a light emitting device package according to an embodiment of the present invention. By way of example, the light emitting device shown in FIG. 13 can be mounted in a flip chip bonding manner in the light emitting device package described above.

The light emitting device according to the embodiment may comprise a light emitting structure 123 disposed on a substrate 124, as shown in FIG. 13.

The light emitting structure 123 may comprise a first conductivity type semiconductor layer 123*a*, an active layer 123*b*, and a second conductivity type semiconductor layer 123*c*.

The light emitting device according to the embodiment may comprise a first electrode 127 and a second electrode 128. The first electrode 127 may comprise a first bonding part 121 and a first branch electrode 125. The first electrode 127 may be electrically connected to the second conductivity type semiconductor layer 123*c*. The first branch electrode 125 may be branched from the first bonding part 121. The first branch electrode 125 may comprise a plurality of branch electrodes branched from the first bonding part 121.

The second electrode 128 may comprise a second bonding part 122 and a second branch electrode 126. The second electrode 128 may be electrically connected to the first conductivity type semiconductor layer 123*a*. The second branch electrode 126 may be branched from the second bonding part 122. The second branch electrode 126 may comprise a plurality of branch electrodes branched from the second bonding part 122.

The first branch electrode 125 and the second branch electrode 126 may be arranged to be alternated from each other in a finger shape. The power supplied through the first bonding part 121 and the second bonding part 122 can be spread and provided to the entire light emitting structure 123 by the first branch electrode 125 and the second branch electrode 126

In the light emitting device according to the embodiment, light generated in the active layer 123*b* may be emitted in six surface directions of the light emitting device. Light generated in the active layer 123*b* may be emitted in six surface directions through the upper and lower surfaces, and four side surfaces of the light emitting device.

Meanwhile, the light emitting device package according to the embodiment described above can be applied to the light source device.

Further, the light source device may comprise a display device, a lighting device, a head lamp, and the like depending on an industrial field.

As an example of the light source device, a display device may comprise a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may not include a color filter, and may have a structure in which the light emitting device emitting red, green, and blue light are disposed, respectively.

As another example of the light source device, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source device, the lighting device may include a cover, a light source module, a heat radiator, a power supply, an inner case, and a socket. In addition, the light source device according to an embodiment may further include at least one of a member and a holder. The light source module may include the light emitting device or the light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the semiconductor device package and the method of manufacturing the semiconductor device package of the embodiments, there is an advantage that light extraction efficiency, electrical characteristics and reliability can be improved.

According to the semiconductor device package and the method of manufacturing the semiconductor device package of the embodiments, there is an advantage that manufacturing cost can be reduced and manufacturing yield can be improved by improving process efficiency and providing new package structure.

The semiconductor device package according to the embodiment has an advantage that the reflector can be prevented from being discolored by providing the body with high reflectance, thereby improving the reliability of the semiconductor device package.

According to the semiconductor device package and the method of manufacturing the semiconductor device of the embodiments, there is an advantage that re-melting phenomenon can be prevented from occurring in the bonding region of the semiconductor device package in the process of re-bonding the semiconductor device package to a board or the like, or heat treatment.

The invention claimed is:

1. A light emitting device package, comprising:
a first package body comprising first and second openings;
a light emitting device disposed on the first package body and comprising first and second bonding parts; and
a first resin disposed between the first package body and the light emitting device,
wherein the light emitting device comprises a first surface on which the first and second bonding parts are disposed,
wherein the first bonding part comprises a first side surface and a lower surface facing the first package body,
wherein the second bonding part comprises a second side surface facing the first side surface and a lower surface facing the first package body,
wherein the first resin comprises an upper surface disposed on the first surface of the light emitting device, a third side surface extending from the upper surface to a lower surface of the first bonding part along the first side surface of the first bonding part, and a fourth side surface extending from the upper surface to a lower surface of the second bonding part along the second side surface of the second bonding part,
wherein the upper surface of the first resin is disposed between the first bonding part and the second bonding part,
wherein the first resin comprises a first lower surface disposed under the first bonding part, a second lower surface disposed under the second bonding part, and a third lower surface connecting the first lower surface and the second lower surface,
wherein the first opening and the first bonding part are vertically overlapped with each other,
wherein the second opening and the second bonding part are vertically overlapped with each other, and
wherein the third lower surface of the first resin is disposed lower than an upper surface of the first package body.

2. The light emitting device package of claim 1, further comprising a second package body disposed on the first package body, and an adhesive layer disposed between the first package body and the second package body.

3. The light emitting device package of claim 2, wherein the first package body and the second package body comprise different materials each other.

4. The light emitting device package of claim 2, wherein the first package body and the second package body comprise different materials selected from PPA, PCT, EMC, SMC, and PI, and
wherein the first package body is formed of a transparent resin, and the second package body comprises at least one of a wavelength conversion material and a reflective material.

5. The light emitting device package of claim 1, further comprising a third opening disposed between the first opening and the second opening, and a second resin disposed in the third opening,
wherein an upper surface of the second resin contacts the first resin, and a side surface of the second resin contacts a side surface of the first package body providing the third opening.

6. The light emitting device package of claim 5, wherein the upper surface of the second resin contacts the lower surfaces of the first and second bonding parts.

7. The light emitting device package of claim 1, further comprising a third resin disposed between the light emitting device and the first package body and contacting the side surfaces of the first and second bonding parts.

8. The light emitting device package of claim 1, wherein the side surface of the first resin contacts the side surfaces of the first and second bonding parts.

9. The light emitting device package of claim 1, further comprising a gap between the facing side surfaces of the first and second bonding parts.

10. The light emitting device package of claim 1, further comprising a first conductive layer disposed in the first opening and electrically connected with the first bonding part, and a second conductive layer disposed in the second opening and electrically connected with the second bonding part.

11. A light emitting device package, comprising:
- a first package body comprising first, second, and third openings passing through an upper surface and a lower surface thereof;
- a light emitting device disposed on the first package body and comprising a first bonding part and a second bonding part; and
- a first resin disposed between the first bonding part and the second bonding part,
- wherein the third opening is disposed between the first opening and the second opening,
- wherein the first bonding part is disposed on the first opening,
- wherein the second bonding part is disposed on the second opening, and
- wherein the first resin is disposed on the third opening.

12. The light emitting device package of claim 11, further comprising a second package body disposed on the first package body, and an adhesive layer disposed between the first package body and the second package body.

13. The light emitting device package of claim 12, wherein the first package body and the second package body comprise different materials each other.

14. The light emitting device package of claim 12, wherein the first package body and the second package body comprise different materials selected from PPA, PCT, EMC, SMC, and PI, and wherein the first package body is formed of a transparent resin, and the second package body comprises at least one of a wavelength conversion material and a reflective material.

15. The light emitting device package of claim 11, further comprising a second resin disposed in the third opening, wherein an upper surface of the second resin contacts the first resin, and a side surface of the second resin contacts a side surface of the first package body providing the third opening.

16. The light emitting device package of claim 15, wherein the upper surface of the second resin contacts lower surfaces of the first and second bonding parts.

17. The light emitting device package of claim 11, further comprising a third resin disposed between the light emitting device and the first package body, and contacting side surfaces of the first and second bonding parts.

18. The light emitting device package of claim 11, wherein a side surface of the first resin contacts side surfaces of the first and second bonding parts.

19. The light emitting device package of claim 11, further comprising a gap between side surfaces facing each other of the first and second bonding parts.

20. The light emitting device package of claim 11, further comprising a first conductive layer disposed in the first opening and electrically connected with the first bonding part, and a second conductive layer disposed in the second opening and electrically connected with the second bonding part.

* * * * *